United States Patent
Mesadri et al.

(10) Patent No.: US 10,379,570 B1
(45) Date of Patent: Aug. 13, 2019

(54) CLOCK DIVIDE-BY-THREE CIRCUIT

(71) Applicant: Xilinx, Inc., San Jose, CA (US)

(72) Inventors: Conrado K. Mesadri, San Jose, CA (US); Bob W. Verbruggen, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/989,619

(22) Filed: May 25, 2018

(51) Int. Cl.
*H03B 19/00* (2006.01)
*G06F 1/08* (2006.01)
*H03K 5/15* (2006.01)
*G06F 1/10* (2006.01)

(52) U.S. Cl.
CPC .............. *G06F 1/08* (2013.01); *G06F 1/10* (2013.01); *H03K 5/15013* (2013.01)

(58) Field of Classification Search
None
See application file for complete search history.

(56) References Cited

U.S. PATENT DOCUMENTS

| | | | | |
|---|---|---|---|---|
| 5,638,191 A * | 6/1997 | Torisawa | ............... | H04N 1/508 358/296 |
| 8,841,948 B1 * | 9/2014 | Chien | .................... | H03L 7/081 327/149 |
| 9,093,997 B1 * | 7/2015 | Kidd | ....................... | H03K 3/017 |
| 9,154,145 B2 * | 10/2015 | Zerbe | .................. | H03K 3/0322 |
| 9,590,797 B1 * | 3/2017 | Brown | ................. | H04L 7/0025 |
| 9,671,799 B2 * | 6/2017 | Krueger | .................... | G05F 1/46 |
| 9,729,119 B1 * | 8/2017 | Blatz | ..................... | H03G 3/3036 |
| 9,935,620 B2 * | 4/2018 | Ishikawa | .............. | H03K 5/1506 |
| 9,973,355 B1 * | 5/2018 | Cartina | ............. | H04L 25/03057 |
| 2007/0044030 A1 * | 2/2007 | Hayles | ...................... | G06F 8/34 715/762 |
| 2008/0301606 A1 * | 12/2008 | Law | ......................... | G06F 1/08 716/113 |
| 2011/0102258 A1 * | 5/2011 | Underbrink | ............. | G01S 19/37 342/357.47 |
| 2014/0035650 A1 * | 2/2014 | Zerbe | ...................... | H03L 7/06 327/299 |

(Continued)

OTHER PUBLICATIONS

Chen, C.F., "Design of a Divide-by-N Asynchronous Odd-Number Counter with 50/50 Duty Cycle", Sep. 1974, pp. 1278-1279, IEEE Proceedings of the IEEE.

(Continued)

*Primary Examiner* — Lincoln D Donovan
*Assistant Examiner* — Khareem E Almo
(74) *Attorney, Agent, or Firm* — William T. Paradice; Yipeng Li

(57) ABSTRACT

A clock divider circuit receives an input clock signal having a first frequency (f) and generates an output signal having a frequency equal to f/N, where N is an odd integer. The clock divider circuit includes an edge counter to count a number of consecutive edges of the input clock signal having a first plurality, and to assert a control signal when a threshold number (N) of consecutive edges has been counted. The clock divider circuit also includes a frequency multiplier to generate an intermediate clock signal having a frequency equal to 2f/N by doubling the frequency of the control signal based at least in part on transitions of the input clock signal, and a frequency divider to generate an output clock signal having a frequency equal to f/N by halving the frequency of the intermediate clock signal.

20 Claims, 7 Drawing Sheets

(56) References Cited

U.S. PATENT DOCUMENTS

2015/0263850 A1* 9/2015 Asada ................. H03L 7/08
375/371

OTHER PUBLICATIONS

Tseng, S.C., et al., "SSH and SHH GaInP/GaAs HBT divide-by-3 prescalers with true 50% duty cycle", The Institution of Engineering and Technology, Electronics Letters, Jul. 6, 2006, pp. 796-797vol. 42, No. 14.

* cited by examiner

US 10,379,570 B1

CLOCK DIVIDE-BY-THREE CIRCUIT

GOVERNMENT RIGHTS

This invention was made, in part, with Government support under Agreement No. HR0011-16-3-0004, awarded by Defense Advanced Research Projects Agency. The Government has certain rights in the invention.

TECHNICAL FIELD

Aspects of the present disclosure generally relate to integrated circuits, and specifically to odd-integer clock dividers for clock signals used in integrated circuit technology.

BACKGROUND

Differential clocks are used in many high-speed mixed-signal applications. A differential clock is typically formed from two component (e.g., single-ended) clock signals. Ideally, the two component signals are complementary in nature (e.g., the first component signal is in a logic-high state whenever the second component signal is in a logic-low state, and vice-versa) and have a 50% duty cycle (e.g., each component signal is in the logic-high state for 50% of a given clock period and in the logic-low state for 50% of the clock period). Complementary clock signals are desirable to avoid short-circuit currents in differential circuits, while a 50% duty cycle is desirable to achieve accurate sampling in double-data rate (DDR) systems. Because high-speed applications often have very precise timing requirements, the differential clocks may be generated using crystal oscillators and/or voltage-controlled oscillators (VCOs).

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to a clock divider circuit capable of dividing the frequency of an input clock signal by an odd integer to produce a balanced output clock signal (e.g., having a 50% duty cycle). An example clock divider circuit includes an input to receive an input clock signal having a first frequency (f). An edge counter counts a number of consecutive edges of the input clock signal having a first polarity, and asserts a control signal when a threshold number (N) of consecutive edges has been counted, where N is an odd integer. A frequency multiplier generates an intermediate clock signal having a frequency equal to 2f/N by doubling the frequency of the control signal based at least in part on transitions of the input clock signal. A frequency divider generates an output clock signal having a frequency equal to f/N by halving the frequency of the intermediate clock signal. In some aspects, the output clock signal may have a duty cycle of 50%.

In some aspects, the edge counter may be configured to assert the control signal for a duration equal to $$\left\lfloor \frac{N}{2} \right\rfloor \times T,$$

where T is a period of the input clock signal. In some embodiments, the frequency multiplier may be configured to generate a first delayed control signal by delaying the control signal by a full duty cycle, generate a second delayed control signal by delaying the control signal by a half duty cycle, and selectively combine the first delayed control signal with the second delayed control signal to produce the intermediate clock signal. In some aspects, the frequency multiplier may combine the first delayed control signal and the second delayed control signal based at least in part on an output of the frequency divider. Still further, in some aspects, the control signal may be a differential signal comprising a positive component signal and a negative component signal.

In some embodiments, the frequency multiplier may comprise a first flip-flop, a second flip-flop, and a multiplexer. The first flip-flop may have an input to receive the positive component signal and an output to provide the first delayed control signal based on transitions of the input clock signal. The second flip-flop may have an input to receive the negative component signal and an output to provide the second delayed control signal based on transitions of an inverted clock signal. For example, the inverted clock signal may be complementary to the input clock signal. The multiplexer may selectively output one of the first delayed control signal or the second delayed control signal as the intermediate clock signal based on a state of the output clock signal. In some aspects, the first delayed control signal may be provided by an inverted output of the first flip-flop and the second delayed control signal may be provided by an inverted output of the second flip-flop.

In some other embodiments, the frequency multiplier may be configured to generate a delayed control signal by delaying the control signal by half its period, and selectively combine the input clock signal with an inverted clock signal to produce the intermediate clock signal based on the control signal and the delayed control signal. For example, the inverted clock signal may be complementary to the input clock signal.

In some embodiments, the frequency multiplier may comprise a first-in first-out (FIFO) register, a flip-flop, and a multiplexer. The FIFO may have an input to receive the control signal and an output to provide an intermediate control signal by delaying the control signal by a duration equal to $$\left\lfloor \frac{N}{2} \right\rfloor \times T,$$

where T is a period of the input clock signal. The flip-flop may have an input to receive the intermediate control signal and an output to provide the delayed control signal based on transitions of the inverted clock signal. The multiplexer may selectively output one of the input clock signal or the inverted clock signal as the intermediate clock signal based on respective states of the control signal and the delayed control signal. In some aspects, the multiplexer may output the input clock signal as the intermediate clock signal when the delayed control signal is asserted, and may output the inverted clock signal as the intermediate clock signal when the control signal is asserted.

The frequency divider may comprise a flip-flop having an input to receive an inverted output signal and an output to provide the output signal based on transitions of the intermediate clock signal. For example, the inverted output signal may be complementary to the output clock signal.

An example method disclosed herein may be used to divide the frequency of an input clock signal by an odd integer to produce a balanced output clock signal (e.g., with a 50% duty cycle). The method may include receiving an input clock signal having a first frequency (f), counting a number of consecutive edges of the input clock signal having a first polarity, asserting a control signal when a threshold number (N) of consecutive edges has been counted (where N is an odd integer), generating an intermediate control signal having a frequency equal to 2f/N by doubling the frequency of the control signal based at least in part on transitions of the input clock signal, and generating an output clock signal having a frequency equal to f/N by halving the frequency of the intermediate clock signal. In some aspects, the output clock signal may have a duty cycle of 50%.

In some aspects, the control signal may be asserted for a duration equal to $$\left\lfloor \frac{N}{2} \right\rfloor \times T,$$

where T is a period of the input clock signal. In some embodiments, the step of generating the intermediate clock signal may include steps of generating a first delayed control signal by delaying the control signal by a full duty cycle, generating a second delayed control signal by delaying the control signal by a half duty cycle, and selectively combining the first delayed control signal with the second delayed control signal to produce the intermediate clock signal. In some aspects, the first delayed control signal and the second delayed control signal may be combined based at least in part on the output clock signal. Still further, in some aspects, the control signal may be a differential signal comprising a positive component signal and a negative component signal.

In some embodiments, the step of generating the intermediate clock signal may further include steps of generating the first delayed control signal by delaying the positive component signal based on transitions of the input clock signal, generating the second delayed control signal by delaying the negative component signal based on transitions of an inverted clock signal (wherein the inverted clock signal is complementary to the input clock signal), and selectively providing one of the first delayed control signal or the second delayed control signal as the intermediate clock signal based on a state of the output clock signal. In some aspects, the first delayed control signal may be complementary to the delayed positive component signal and the second delayed control signal may be complementary to the delayed negative component signal.

In some other embodiments, the step of generating the intermediate clock signal may include steps of generating a delayed control signal by delaying the control signal by half its period, and selectively combining the input clock signal with an inverted clock signal to produce the intermediate clock signal based on the control signal and the delayed control signal. For example, the inverted clock signal may be complementary to the input clock signal.

In some embodiments, the step of generating the intermediate clock signal may further include steps of generating an intermediate control signal by delaying the control signal by a duration equal to $$\left\lfloor \frac{N}{2} \right\rfloor \times T$$

(where T is a period of the input clock signal), generating the delayed control signal by delaying the intermediate control signal based on transitions of the inverted clock signal, and selectively providing one of the input clock signal or the inverted clock signal as the intermediate clock signal based on respective states of the control signal and the delayed control signal. In some aspects, the step of selectively providing one of the input clock signal or the inverted clock signal as the intermediate clock signal includes steps of outputting the input clock signal as the intermediate clock signal when the delayed control signal is asserted, and outputting the inverted clock signal as the intermediate clock signal when the control signal is asserted.

The step of generating the output clock signal may include a step of generating the output clock signal by delaying an inverted output signal based on transitions of the intermediate clock signal. For example, the inverted output signal may be complementary to the output clock signal.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1A:
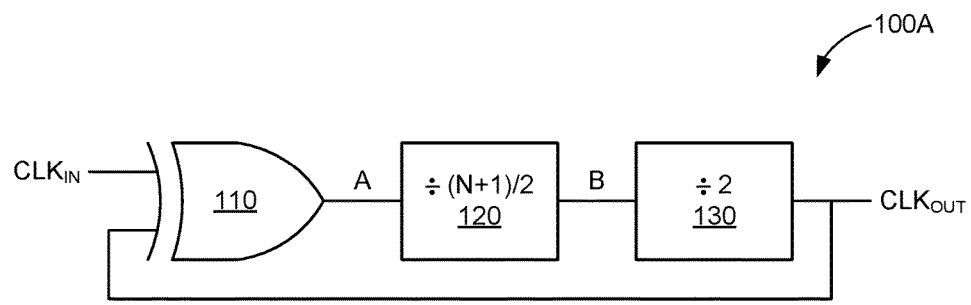
FIG. 1A shows a conventional divide-by-N clock divider circuit.

A clock divider may be used to divide the frequency of a high-frequency clock, by a desired factor (N), to produce a lower-frequency clock signal. FIG. 1A shows a conventional divide-by-N clock divider circuit 100A. The clock divider circuit 100A includes an XOR logic gate 110, a first frequency divider stage 120, and a second frequency divider stage 130. The XOR logic gate 110 receives an input clock signal ($CLK_{IN}$) and output clock signal ($CLK_{OUT}$) as inputs, and produces an XOR combination of $CLK_{IN}$ and $CLK_{OUT}$ at its output (A). The first frequency divider stage 120 receives the output of the XOR logic gate 110 and divides the frequency of the received signal by (N+1)/2. The second frequency divider stage 130 receives the output (B) of the first frequency divider stage 120 and divides the frequency of the received signal by 2 to produce the output clock signal.

Figure 1B:
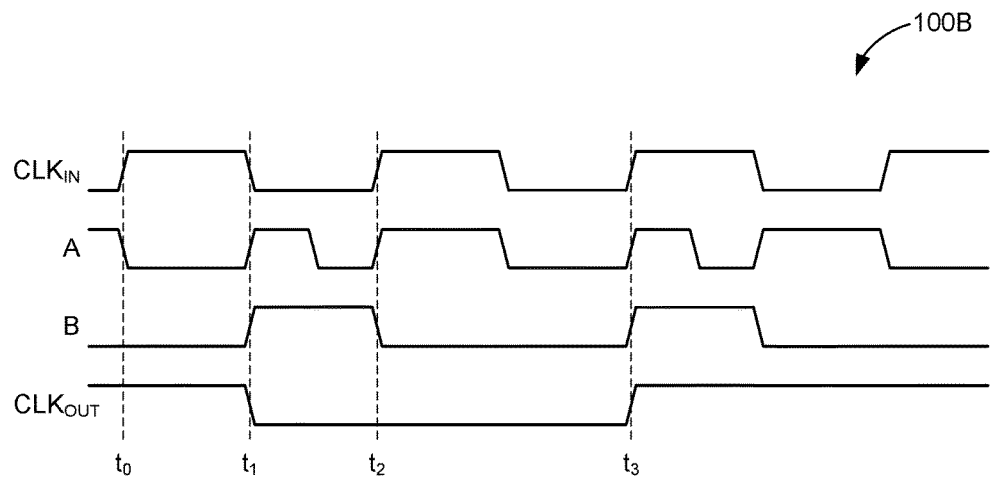
FIG. 1B shows an example timing diagram depicting an operation of the frequency divider circuit of FIG. 1A.

FIG. 1B shows an example timing diagram 100B depicting an operation of the frequency divider circuit 100A, of FIG. 1A, operating as a divide-by-3 clock divider (e.g., N=3). As shown in FIG. 1B, the XOR logic gate 110 generates an intermediate signal (A) having a frequency greater than that of the input clock signal. For example, between times $t_1$ and $t_2$, the output (A) of the XOR logic gate 110 transitions twice (e.g., two rising-edge transitions) for a single transition of $CLK_{IN}$ (e.g., one rising-edge transition). Accordingly, the XOR logic gate 110 has effectively doubled the instantaneous frequency of the input clock signal (e.g., from times $t_1$ to $t_2$). More generally, for N=3, the XOR logic gate 110 must drive 4 rising-edge transitions for every 3 rising-edge transitions of $CLK_{IN}$ (such as between times $t_0$ and $t_3$). Because the output (A) of the XOR logic gate 110 has a frequency even higher than that of the input clock signal, the frequency divider circuit 100A may be unreliable and/or unusable as a clock divider for high frequency clock signals.

As described above, differential clock signals are often used in double-data rate (DDR) systems. Complementary clock signals are desirable to avoid short-circuit currents in differential circuits, while a 50% duty cycle is desirable to achieve accurate sampling in DDR applications. Duty cycle distortion may cause deterministic jitter in DDR systems. Even in non-DDR circuits (e.g., which are triggered by only the rising edge of a clock signal), a 50% duty cycle may maximize operation speed, for example, in flip-flops comprising master-slave latches. A clock divider may be used to divide the frequency of a high-frequency clock, by a desired factor (N), to produce a lower-frequency clock signal. However, as described above with respect to FIGS. 1A and 1B, conventional divide-by-N clock dividers (where N is an odd integer) typically operate by generating an intermediate signal (e.g., at the output of the XOR gate 110 of FIG. 1A) having a frequency even higher than that of the input clock signal, making such clock dividers unsuitable for high frequency clock signals.

Aspects of the present disclosure provide an odd-integer clock divider circuit, capable of producing an output clock signal having a 50% duty cycle, that does not incur a penalty on the maximum operating frequency of the clock divider circuitry. In some embodiments, a clock divider circuit may reduce the frequency of an input clock signal by a factor of N (e.g., where N is an odd integer) by first generating a control signal based on a number of consecutive rising (or falling) edge transitions of the input clock signal. For example, an edge counter may count the number of consecutive rising (or falling) edges of the input clock signal, and may assert the control signal each time N consecutive rising (or falling) edges have been counted. In some aspects, the edge counter may assert the control signal for a duration equal to $$\left\lfloor \frac{N}{2} \right\rfloor \times T$$

(where T represents the period of the input clock signal). The clock divider circuit may then double the frequency of the control signal to produce an intermediate clock signal having a frequency equal to 2f/N, where f is the frequency of the input clock signal, and may finally divide the frequency of the control signal in half to produce an output clock signal have a frequency equal to f/N.

In the example embodiments, the clock divider circuit never produces an intermediate signal having a higher frequency than that of the input clock signal. For example, neither the control signal nor the intermediate clock signal has a frequency greater than that of the input clock signal. Accordingly, the clock divider circuit of the present embodiments may produce an output clock signal with a frequency that is 1/N times the frequency of the input clock signal, and a 50% duty cycle, without incurring any penalty from the frequency of the input clock signal. Thus, the frequency-dividing techniques disclosed herein may be better suited for high-speed systems and applications than the frequency-dividing techniques implemented by conventional clock dividers.

Figure 2:
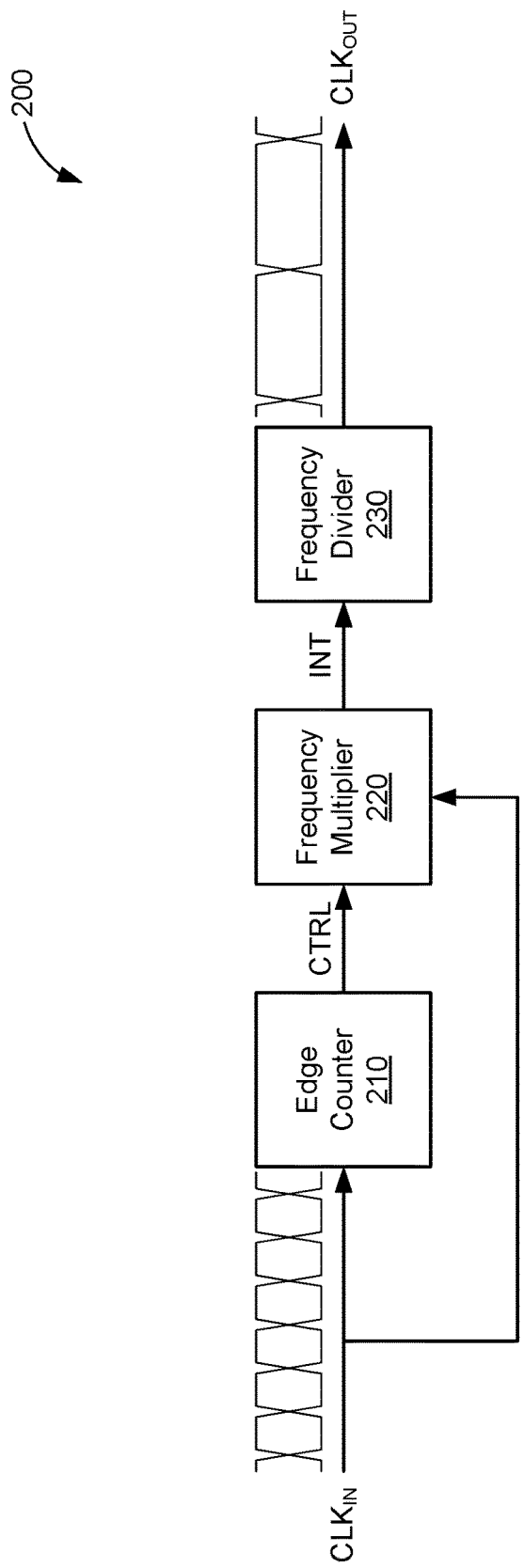
FIG. 2 shows an example block diagram of a clock divider circuit, in accordance with some embodiments.

FIG. 2 shows an example block diagram of a clock divider circuit 200, in accordance with some embodiments. The clock divider circuit 200 is configured to receive an input clock signal ($CLK_{IN}$) and generate a frequency-adjusted output clock signal ($CLK_{OUT}$) based on the input clock signal $CLK_{IN}$. In some aspects, the input clock signal $CLK_{IN}$ may be a differential clock signal having a frequency $f_{IN}$. For example, the input clock signal $CLK_{IN}$ may comprise a pair of complementary (e.g., single-ended) signals. The clock divider circuit 200 may divide the frequency $f_{IN}$ of the input clock signal $CLK_{IN}$ by an integer (N), to generate a balanced output clock signal $CLK_{OUT}$ with a frequency equal to $f_{IN}/N$ (e.g., and a 50% duty cycle). In some aspects, N may be an odd integer value. The clock divider circuit 200 includes an edge counter 210, a frequency multiplier 220, and a frequency divider 230.

The edge counter 210 may count a number of consecutive edge transitions of the same polarity (e.g., rising edges or falling edges) in the input clock signal $CLK_{IN}$. In some embodiments, the edge counter 210 may be a down-counter configured to count down a number (N) of edges detected in succession. When the countdown reaches zero, the edge counter 210 may assert a control signal (CTRL) to a logic-high state. In some aspects, the control signal CTRL may remain in the logic-high state for a duration equal to $$\left\lfloor \frac{N}{2} \right\rfloor \times T_{IN}$$

(where $T_{IN}$ represents the period of the input clock signal $CLK_{IN}$). For example, when N=3, the edge counter 210 may deassert the control signal CTRL to a logic-low state when the next rising (or falling) edge of the input clock signal $CLK_{IN}$ arrives $$\left( e.g., \left\lfloor \frac{3}{2} \right\rfloor \times T_{IN} = T_{IN} \right).$$

As a result, the frequency of the control signal CTRL may be equal to $f_{IN}/N$. It is noted that, while the edge counter 210 has effectively divided the frequency of the input clock signal $CLK_{IN}$ by a factor of N, the control signal CTRL does not have a 50% duty cycle. As described in greater detail below, due to the asymmetrical nature of the edge counter 210, the control signal CTRL will have a duty cycle much smaller than 50% (e.g., for any odd integer values of N≥3).

The frequency multiplier 220 may generate an intermediate clock signal (INT) having a frequency equal to $2f_{IN}/N$ by doubling the frequency of the control signal CTRL based, at least in part, on transitions of the input clock signal. In some embodiments, the frequency multiplier 220 may include a plurality of parallel flip-flops configured to sample and output multiple delayed versions of the control signal CTRL. The delayed versions of the control signal may be selectively combined (e.g., via a multiplexer) to produce the intermediate clock signal INT. In some other embodiments, the frequency multiplier 220 may include a plurality of flip-flops coupled in series to sample and output a delayed version of the control signal CTRL. The delayed version of the control signal may then be used, together with the original control signal CTRL, to selectively combine the complementary component signals (e.g., $CLK_{IN+}$ and $CLK_{IN-}$) of the input clock signal $CLK_{IN}$ to produce the intermediate clock signal INT.

The frequency divider 230 may generate an output clock signal having a frequency equal to $f_{IN}/N$ by halving the frequency of the intermediate clock signal INT. In some embodiments, the frequency divider 230 may include one or more flip-flops that are triggered by the intermediate clock signal INT. For example, the frequency divider 230 may include a first flip-flop to toggle (e.g., assert and deassert) the output clock signal $CLK_{OUT}$ in response to rising (or falling) edge transitions of the intermediate clock signal INT. In some aspects, the frequency divider 230 may include a second flip-flop to provide, and toggle, a complementary output clock signal (e.g., $CLK_{OUT+}$ or $CLK_{OUT-}$) in response to rising (or falling) edge transitions of the intermediate clock signal INT. The resulting output clock signal $CLK_{OUT}$ has a frequency equal to $f_{IN}/N$ and a 50% duty cycle.

It is noted that, in generating the output clock signal $CLK_{OUT}$, the clock divider circuit 200 never produces a signal at a higher frequency than that of the input clock signal $CLK_{IN}$ (e.g., $f_{IN}$). For example, the frequency of the control signal CTRL (e.g., $f_{IN}/N$) and the frequency of the intermediate clock signal INT (e.g., $2f_{IN}/N$) are both lower than the frequency of the input clock signal $CLK_{IN}$ (e.g., for any odd integer values of N≥3). Accordingly, the clock divider circuit of the present embodiments is not limited by the frequency of the input clock signal $CLK_{IN}$, and may therefore be more suitable for high-speed applications than conventional clock dividers.

Figure 3:
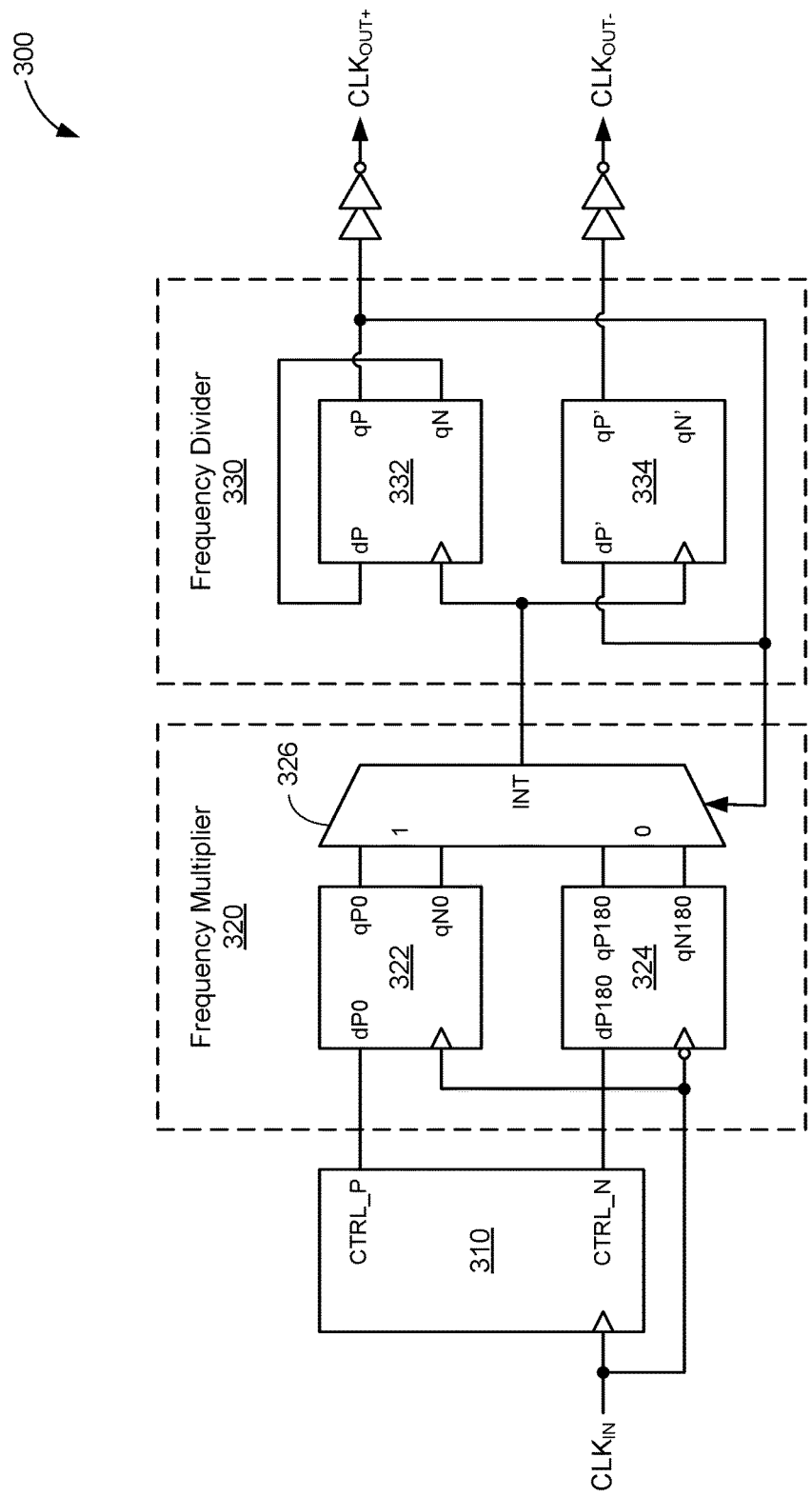
FIG. 3 shows a block diagram of a divide-by-N clock divider circuit capable of dividing the frequency of an input clock signal by an odd integer, in accordance with some embodiments.

FIG. 3 shows a block diagram of a divide-by-N clock divider circuit 300 capable of dividing the frequency of an input clock signal by an odd integer, in accordance with some embodiments. The clock divider circuit 300 may be an example embodiment of the clock divider circuit 200 of FIG. 2. For example, the clock divider circuit 300 may be configured to receive an input clock signal $CLK_{IN}$ and generate a frequency-adjusted output clock signal $CLK_{OUT}$ based on the input clock signal $CLK_{IN}$. In some aspects, the input clock signal $CLK_{IN}$ may be a differential clock signal (e.g., comprising a pair of complementary component signals) having a frequency equal to $f_{IN}$.

The clock divider circuit 300 may divide the frequency $f_{IN}$ of the input clock signal $CLK_{IN}$ by an integer (N), to generate the output clock signal $CLK_{OUT}$ with a frequency equal to $f_{IN}/N$. In some aspects, N may be an odd integer value. The output clock signal $CLK_{OUT}$ may also be a differential clock signal comprising a pair of complementary component signals ($CLK_{OUT+}$ and $CLK_{OUT-}$). The clock divider circuit 300 includes an edge counter 310, a frequency multiplier 320, and a frequency divider 330. The edge counter 310, frequency multiplier 320, and frequency divider 330 may be example embodiments of the edge counter 210, frequency multiplier 220, and frequency divider 230, respectively, of FIG. 2. For example, the edge counter 310 may produce a control signal based on a number of consecutive rising (or falling) edge transitions of the input clock signal $CLK_{IN}$, the frequency multiplier 320 may produce an intermediate clock signal by doubling the frequency of the control signal, and the frequency divider 330 may produce the output clock signal $CLK_{OUT}$ by halving the frequency of the intermediate clock signal.

The edge counter 310 includes an input to receive the input clock signal $CLK_{IN}$, and a pair of outputs (CTRL_P and CTRL_N) to provide the control signal based on the number of consecutive rising (or falling) edges of the input clock signal $CLK_{IN}$ counted by the edge counter 310. For purposes of discussion, the CTRL_P output of the edge counter 310 may correspond to the control signal and the CTRL_N output of the edge counter 310 may correspond to an inverted control signal that is complementary to the control signal. In some embodiments, the edge counter 310 may assert the control signal (e.g., by driving the CTRL_P output to a logic-high state and driving the CTRL_N output to a logic-low state) for every N consecutive rising edges of the input clock signal $CLK_{IN}$. In some aspects, the edge counter 310 may continue to assert the control signal (e.g., by maintaining CTRL_P in the logic-high state and CTRL_N in the logic-low state) for a duration equal to $$\left\lfloor \frac{N}{2} \right\rfloor \times T_{IN}$$

(where $T_{IN}$ represents the period of the input clock signal $CLK_{IN}$).

In some aspects, the edge counter 310 may operate as a down-counter configured to count down a number (N) of rising edges detected in succession and assert the control signal when the countdown reaches zero. The edge counter 310 may reset the counter (e.g., to N) once the count value reaches zero. In some aspects, the edge counter 310 may subsequently deassert the control signal (e.g., by driving the CTRL_P output to a logic-low state and driving the CTRL_N output to a logic-high state) after a duration equal to $$\left\lfloor \frac{N}{2} \right\rfloor \times T_{IN}$$

has elapsed. For example, when N=3, the edge counter 310 may deassert the control signal in response to the next rising-edge transition of the input clock signal $CLK_{IN}$.

The frequency multiplier 320 includes a pair of flip-flops 322 and 324 and a multiplexer 326. The flip-flops 322 and 324 are configured to receive the control signal from the edge counter 310, and to output delayed versions of the control signal based on rising (or falling) edge transitions of the input clock signal $CLK_{IN}$. More specifically, the flip-flop 322 includes an input (dP0) coupled to the CTRL_P output of the edge counter 310 and a clock input to receive the input clock signal $CLK_{IN}$. In some embodiments, the flip-flop 322 may sample or "clock-in" the current state of the control signal (e.g., CTRL_P) when the input clock signal $CLK_{IN}$ transitions to a logic-high state (e.g., corresponding to a rising-edge transition of $CLK_{IN}$). The flip-flop 322 further includes an output (qP0) to output a signal corresponding to the current state of the sampled control signal, and an inverted output (qN0) to output a signal that is complementary to the output of qP0. Therefore, the output qP0 of the flip-flop 322 may correspond to a delayed version of the control signal CTRL_P. As described in greater detail below, the flip-flop 322 may delay the control signal CTRL_P by a full duty-cycle (or ⅓ the period of the control signal).

The flip-flop 324 includes an input (dP180) coupled to the CTRL_N output of the edge counter 310 and a clock input to receive an inverted clock signal. For example, the inverted clock signal may be complementary to the input clock signal $CLK_{IN}$. In some embodiments, the flip-flop 324 may sample or clock-in the current state of the inverted control signal (e.g., CTRL_N) when the inverted clock signal transitions to a logic-high state (e.g., corresponding to a falling-edge transition of $CLK_{IN}$). The flip-flop 324 further includes an output (qP180) to output a signal corresponding to the current state of the sampled inverted control signal, and an inverted output (qN180) to output a signal that is complementary to the output of qP180. Therefore, the output qP180 of the flip-flop 324 may correspond to a delayed version of the inverted control signal CTRL_N. As described in greater detail below, the flip-flop 324 may delay the inverted control signal CTRL_N by a half duty-cycle (or ⅙ the period of the control signal).

The multiplexer 326 includes a pair of inputs (0 and 1) coupled to the outputs of the flip-flops 322 and 324, and an output (INT) to provide the intermediate clock signal based on the signals received at one of its inputs. For example, the first input (1) of the multiplexer 326 may be coupled to the outputs qP0 and qN0 of flip-flop 322, and the second input (0) of the multiplexer 326 may receive the outputs qP180 and qN180 of flip-flop 324. In some embodiments, the multiplexer 326 may selectively provide the outputs of one of the flip-flops 322 or 324 as the intermediate clock signal based on a state of the output clock signal $CLK_{OUT}$.

In the example of FIG. 3, the selection is performed based on the state of $CLK_{OUT+}$. For example, when $CLK_{OUT+}$ is in a logic-high state, the multiplexer 326 will pass the signals at its first input (1) to its output INT. During this time, the intermediate clock signal will track the outputs qP0 and qN0 of flip-flop 322. When $CLK_{OUT+}$ is in a logic-low state, the multiplexer 326 passes the signals at its second input (0) to its output INT. During this time, the intermediate clock signal will track the outputs qP180 and qN180 of flip-flop 324. As described in greater detail below, by selectively combining the outputs of the flip-flops 322 and 324 in this manner, the multiplexer 326 may produce an intermediate clock signal having a frequency that is 2/N times that of the input clock signal $CLK_{IN}$.

The frequency divider 330 includes a pair of flip-flops 332 and 334. The flip-flops 332 and 334 are configured to receive the intermediate clock signal from the multiplexer 326, and to toggle the output clock signals $CLK_{OUT+}$ and $CLK_{OUT-}$ based on rising (or falling) edge transitions of the intermediate clock signal. In the example of FIG. 3, two flip-flops 332 and 334 are used to provide a differential output clock signal (e.g., including component signals $CLK_{OUT+}$ and $CLK_{OUT-}$). However, in other embodiments, the frequency divider 330 may include only a single flip-flop (such as flip-flop 332) to produce a single-ended output clock signal (e.g., including only $CLK_{OUT+}$).

The flip-flop 332 includes a clock input coupled to the output of the multiplexer 326 and an input (dP) coupled, in feedback, to an inverted output (qN) of the flip-flop 332. In some embodiments, the flip-flop 332 may sample or clock-in the current state of its inverted output qN when the intermediate clock signal transitions to a logic-high state (e.g., corresponding to a rising-edge transition of INT). The flip-flop 332 further includes an output (qP) to output a signal corresponding to the current state of the signal sampled at its input dP. In some embodiments, the output qP of the flip-flop 332 may be configured to provide the output clock signal $CLK_{OUT+}$. Since the output qP of the flip-flop 332 tracks the inverted output qN (e.g., with a given amount of delay), the flip-flop 332 may toggle the output clock signal $CLK_{OUT+}$ between a logic-high state and a logic-low state based on rising-edge transitions of the intermediate clock signal. As described in greater detail below, the flip-flop 332 may produce an output clock signal $CLK_{OUT+}$ having a 50% duty cycle and a frequency that is 1/N times the that of the input clock signal $CLK_{IN}$.

The flip-flop 334 includes a clock input coupled to the output of the multiplexer 326 and an input (dP') coupled to the output qP of the flip-flop 332. In some embodiments, the flip-flop 334 may sample or clock-in the current state of the output clock signal $CLK_{OUT+}$ when the intermediate clock signal transitions to a logic-high state (e.g., corresponding to a rising-edge transition of INT). The flip-flop 334 further includes an output (qP') to output a signal corresponding to the current state of the sampled output clock signal $CLK_{OUT+}$. In some embodiments, the output qP' of the flip-flop 334 may be configured to provide the complementary output clock signal $CLK_{OUT-}$. Since the output qP' of the flip-flop 334 tracks the output clock signal $CLK_{OUT+}$ (e.g., with a given amount of delay), the flip-flop 334 may toggle the complementary output clock signal $CLK_{OUT-}$ between a logic-high state and a logic-low state based on rising-edge transitions of the intermediate clock signal. More specifically, the complementary output clock signal $CLK_{OUT-}$ may correspond to a delayed version of the output clock signal $CLK_{OUT+}$ (e.g., delayed by a full duty-cycle). Moreover, because the output clock signal $CLK_{OUT+}$ has a 50% duty cycle, the flip-flop 334 may also produce a complementary output clock signal $CLK_{OUT-}$, having a 50% duty cycle, that is complementary to the output clock signal $CLK_{OUT+}$.

Figure 4:
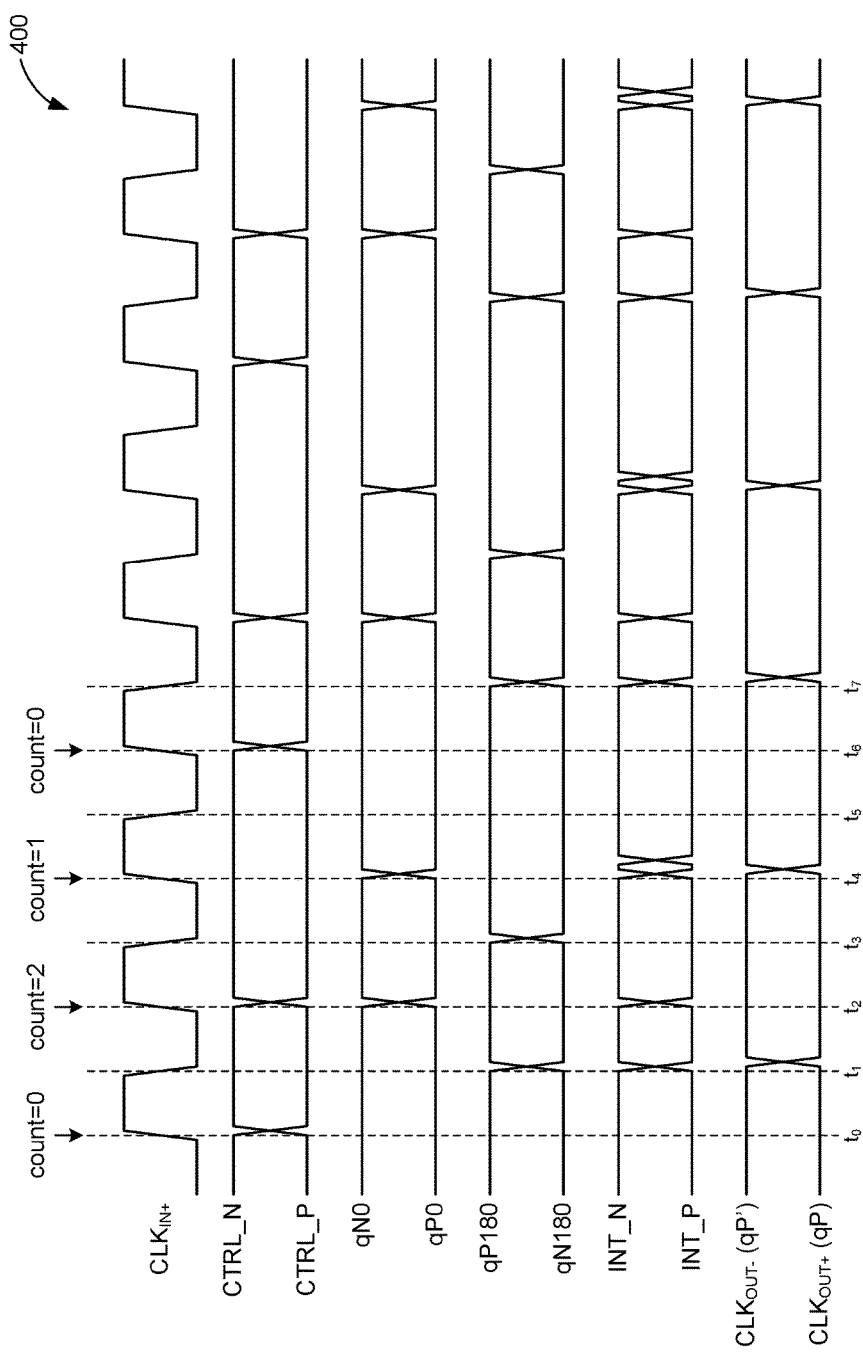
FIG. 4 shows a timing diagram depicting an example operation of the clock divider circuit of FIG. 3.

FIG. 4 shows a timing diagram depicting an example operation of the clock divider circuit 300 of FIG. 3. As described above, the clock divider circuit 300 may be configured to receive an input clock signal $CLK_{IN}$ and generate a frequency-adjusted output clock signal $CLK_{OUT}$ based on the input clock signal $CLK_{IN}$. In some aspects, the input clock signal $CLK_{IN}$ may be a differential clock signal comprising a pair of complementary component signals (e.g., $CLK_{IN+}$ and $CLK_{IN-}$). For simplicity, however, only one of the component signals ($CLK_{IN+}$) is depicted in the example of FIG. 4. In the example of FIG. 4, the clock divider circuit 300 is implemented as a divide-by-three frequency divider (e.g., the frequency of $CLK_{OUT}$ is one-third the frequency of $CLK_{IN}$).

At time $t_0$, the input clock signal $CLK_{IN+}$ transitions to a logic-high state. In the example of FIG. 4, the edge counter 310 has already counted two consecutive rising-edge transitions of the input clock signal $CLK_{IN+}$ (e.g., count=1) prior to time $t_0$. Thus, upon detecting the rising-edge transition of the input clock signal $CLK_{IN+}$ at time $t_0$, the edge counter 310 may decrement its current count value (e.g., count=0). Because the count value has reached zero (e.g., indicating that the edge counter 310 has counted three consecutive rising-edge transitions of $CLK_{IN+}$ since the last time the count value was reset), the edge counter 310 may assert the control signal (e.g., by driving CTRL_P to a logic-high state and driving CTRL_N to a logic-low state) and reset the count value (e.g., count=3) in response to the rising-edge transition of the input clock signal $CLK_{IN+}$ at time $t_0$.

The flip-flop 322 clocks-in the current state of CTRL_P in response to the rising-edge transition of the input clock signal $CLK_{IN+}$ at time $t_0$. Since CTRL_P is in a logic-low state at time $t_0$, the output qP0 of flip-flop 322 also remains in a logic-low state (and the inverted output qN0 remains in a logic-high state). At time $t_0$, the output qP180 of flip-flop 324 is in a logic-high state. However, because flip-flop 324 is triggered by falling-edge transitions of the input clock signal $CLK_{IN+}$ (or rising-edge transitions of an inverted clock signal $CLK_{IN-}$ that is complementary to $CLK_{IN+}$), the output qP180 of flip-flop 324 remains in the logic-high state (and the inverted output qN180 remains in a logic-low state). It is noted that the output clock signal $CLK_{OUT+}$ is in a logic-low state at time $t_0$. Thus, the multiplexer 326 may select (or continue to select) the outputs qP180 and qN180 of flip-flop 324 for output as the intermediate clock signal (INT_N and INT_P) at time $t_0$. In the example of FIG. 4, a negative component signal INT_N of the intermediate clock signal tracks the output qP180 of flip-flop 324 whereas a positive component signal INT_P (also referred to herein simply as the intermediate clock signal) tracks the inverted output qN180. Accordingly, INT_P remains in a logic-low state while INT_N remains in a logic-high state at time $t_0$.

In the example of FIG. 4, the output qP of flip-flop 332 (e.g., corresponding to the output clock signal $CLK_{OUT+}$) is in a logic-low state at time $t_0$. However, because flip-flop 332 is triggered by rising-edge transitions of the intermediate clock signal INT_P (or falling-edge transitions of INT_N), the output qP of flip-flop 332 remains in the logic-low state (and the inverted output qN remains in a logic-high state) after time $t_0$. The output qP' of flip-flop 334 (e.g., corresponding to the complementary output clock signal $CLK_{OUT-}$) is in a logic-high state at time $t_0$. However, because flip-flop 334 is also triggered by rising-edge transitions of the intermediate clock signal INT_P (or falling-edge transitions of INT_N), the output qP' of flip-flop 334 remains in the logic-high state after time $t_0$.

At time $t_1$, the input clock signal $CLK_{IN+}$ transitions to a logic-low state. Since the edge counter 310 is triggered by rising-edge transitions of the input clock signal $CLK_{IN+}$, the count value does not change (e.g., count=3) and the control signal remains asserted. More specifically, CTRL_P remains in the logic-high state and CTRL_N remains in the logic-low state at time $t_1$. The flip-flop 322 is also triggered by rising-edge transitions of the input clock signal $CLK_{IN+}$. Therefore, the output qP0 of flip-flop 322 remains in the logic-low state (and the inverted output qN0 remains in the logic-high state) at time $t_1$.

Because flip-flop 324 is triggered by falling-edge transitions of the input clock signal $CLK_{IN+}$, the flip-flop 324 may clock-in the current state of CTRL_N at time $t_1$. Since CTRL_N is in the logic-low state at time $t_1$, the output qP180 of flip-flop 324 transitions to the logic-low state (and the inverted output qN180 transitions to the logic-high state) in response to the falling-edge transition of the input clock signal $CLK_{IN+}$. At time $t_1$, the intermediate clock signals INT_P and INT_N continue to track the outputs qN180 and qP180, respectively, of flip-flop 324 (e.g., since the output clock signal $CLK_{OUT+}$ remains in the logic-low state). Therefore, the transition in the outputs qP180 and qN180 of the flip-flop 324 causes a corresponding transition in the intermediate clock signals INT_N and INT_P. More specifically, INT_P transitions to a logic-high state and INT_N transitions to a logic-low state in response to the falling-edge transition of the input clock signal $CLK_{IN+}$ at time $t_1$.

The flip-flop 332 clocks-in the current state of its inverted output qN at the time the intermediate clock signal INT_P transitions to the logic-high state. Since the inverted output qN of flip-flop 332 is in the logic-high state at time $t_1$, the output qP of flip-flop 332 transitions to a logic-high state (and the inverted output qN transitions to a logic-low state) in response to the rising-edge transition of the intermediate clock signal INT_P. The flip-flop 334 clocks-in the current state of the output clock signal $CLK_{OUT+}$ at the time the intermediate clock signal INT_P transitions to the logic-high state. Since the output clock signal $CLK_{OUT+}$ is in the logic-low state at time $t_1$, the output qP' of flip-flop 334 transitions to a logic-low state in response to the rising-edge transition of the intermediate clock signal INT_P.

It is noted that, once the output clock signal $CLK_{OUT+}$ transitions to the logic-high state, the multiplexer 326 will select the outputs qP0 and qN0 of flip-flop 322 for output as the intermediate clock signals INT_N and INT_P. In the example of FIG. 4, the negative component signal INT_N tracks the output qP0 of flip-flop 322 whereas the positive component signal INT_P tracks the inverted output qN0. However, because the output qP0 of flip-flop 322 is in the logic low-state (and the inverted output qN0 is in the logic-high state) from times $t_1$ to $t_2$, the intermediate clock signals INT_N and INT_P remain unchanged even after the change in selection by the multiplexer 326. In other words, INT_P remains in the logic-high state and INT_N remains in the logic-low state even after the output clock signal $CLK_{OUT+}$ transitions to the logic-high state.

At time $t_2$, the input clock signal $CLK_{IN+}$ transitions back to the logic-high state. Upon detecting the next rising-edge transition of the input clock signal $CLK_{IN+}$ at time $t_2$, the edge counter 310 may decrement its current count value (e.g., count=2). Because the count value is greater than zero, the edge counter 310 may deassert the control signal (e.g., by driving CTRL_P to a logic-low state and driving CTRL_N to a logic-high state) in response to the rising-edge transition of the input clock signal $CLK_{IN+}$ at time $t_2$.

The flip-flop 322 clocks-in the current state of CTRL_P in response to the rising-edge transition of the input clock signal $CLK_{IN+}$ at time $t_2$. Since CTRL_P is in the logic-high state at time $t_2$, the output qP0 of flip-flop 322 transitions to a logic-high state (and the inverted output qN0 transitions to a logic-low state) in response to the rising-edge transition of the input clock signal $CLK_{IN+}$ at time $t_2$. Because flip-flop 324 is triggered by falling-edge transitions of the input clock signal $CLK_{IN+}$, the output qP180 of flip-flop 324 remains in the logic-low state (and the inverted output qN180 remains the logic-high state). It is noted that the output clock signal $CLK_{OUT+}$ remains in the logic-high state at time $t_2$. Thus, the multiplexer 326 continues to select the outputs qP0 and qN0 of flip-flop 322 for output as the intermediate clock signals INT_N and INT_P at time $t_2$. Since INT_N tracks the output qP0 of flip-flop 322 and INT_P tracks the inverted output qN0, the intermediate clock signals INT_N and INT_P will also transition in response to the rising-edge transition of the input clock signal $CLK_{IN+}$ at time $t_2$. More specifically, INT_P transitions back to the logic-low state and INT_N transitions back to the logic-high state in response to the rising-edge transition of the input clock signal $CLK_{IN+}$ at time $t_2$.

The output qP of flip-flop 332 is in the logic-high state at time $t_2$. However, because flip-flop 332 is triggered by rising-edge transitions of the intermediate clock signal INT_P (or falling-edge transitions of INT_N), the output qP of flip-flop 332 remains in the logic-high state (and the inverted output qN remains in the logic-low state) even after the falling-edge transition of the intermediate clock signal INT_P at time $t_2$. The output qP' of flip-flop 334 is in the logic-low state at time $t_2$. However, because flip-flop 334 is also triggered by rising-edge transitions of the intermediate clock signal INT_P (or falling-edge transitions of INT_N), the output qP' of flip-flop 334 remains in the logic-high state even after the falling-edge transition of the intermediate clock signal INT_P at time $t_2$.

At time $t_3$, the input clock signal $CLK_{IN+}$ transitions back to the logic-low state. Since the edge counter 310 is triggered by rising-edge transitions of the input clock signal $CLK_{IN+}$, the count value does not change (e.g., count=2) and the control signal remains deasserted. More specifically, CTRL_P remains in the logic-low state and CTRL_N remains in the logic-high state at time $t_3$. The flip-flop 322 is also triggered by rising-edge transitions of the input clock signal $CLK_{IN+}$. Therefore, the output qP0 of flip-flop 322 remains in the logic-high state (and the inverted output qN0 remains in the logic-low state) at time $t_3$.

The flip-flop 324 may clock-in the current state of CTRL_N at time $t_3$. Since CTRL_N is in the logic-high state at time $t_3$ the output qP180 of flip-flop 324 transitions to the logic-high state (and the inverted output qN180 transitions to the logic-low state) in response to the falling-edge transition of the input clock signal $CLK_{IN+}$. At time $t_3$, the intermediate clock signals INT_P and INT_N continue to track the outputs qN0 and qP0, respectively, of flip-flop 322 (e.g., since the output clock signal $CLK_{OUT+}$ remains in the logic-high state). Since the state of the outputs qP0 and qN0 of flip-flop 322 has not changed at time $t_3$, the intermediate clock signals INT_N and INT_P also do not change. More specifically, INT_P remains in the logic-low state and INT_N remains in the logic-high state even after the falling-edge transition of the input clock signal $CLK_{IN+}$ at time $t_3$.

Because flip-flop 332 is triggered by rising-edge transitions of the intermediate clock signal INT_P (or falling-edge transitions of INT_N), the output qP of flip-flop 332 remains in the logic-high state (and the inverted output qN remains in the logic-low state) after time $t_3$. Because flip-flop 334 is also triggered by rising-edge transitions of the intermediate clock signal INT_P (or falling-edge transitions of INT_N), the output qP' of flip-flop 334 remains in the logic-low state after time $t_3$.

At time $t_4$, the input clock signal $CLK_{IN+}$ transitions once again to the logic-high state. Upon detecting the next rising-edge transition of the input clock signal $CLK_{IN+}$ at time $t_4$, the edge counter 310 may decrement its current count value (e.g., count=1). Because the count value is still greater than zero, the edge counter 310 may continue deasserting the control signal (e.g., by maintaining CTRL_P in the logic-low state and maintaining CTRL_N in the logic-high state) in response to the rising-edge transition of the input clock signal $CLK_{IN+}$ at time $t_4$.

The flip-flop 322 clocks-in the current state of CTRL_P in response to the rising-edge transition of the input clock signal $CLK_{IN+}$ at time $t_4$. Since CTRL_P is in the logic-low state at time $t_4$, the output qP0 of flip-flop 322 transitions to the logic-low state (and the inverted output qN0 transitions to the logic-high state) in response to the rising-edge transition of the input clock signal $CLK_{IN+}$ at time $t_4$. Because flip-flop 324 is triggered by falling-edge transitions of the input clock signal $CLK_{IN+}$, the output qP180 of flip-flop 324 remains in the logic-high state (and the inverted output qN180 remains the logic-low state). It is noted that the output clock signal $CLK_{OUT+}$ remains in the logic-high state at time $t_4$. Thus, the multiplexer 326 continues to select the outputs qP0 and qN0 of flip-flop 322 for output as the intermediate clock signals INT_N and INT_P at time $t_4$. Since INT_N tracks the output qP0 of flip-flop 322 and INT_P tracks the inverted output qN0, the intermediate clock signals INT_N and INT_P will also transition in response to the rising-edge transition of the input clock signal $CLK_{IN+}$ at time $t_4$. More specifically, INT_P transitions back to the logic-high state and INT_N transitions back to the logic-low state in response to the rising-edge transition of the input clock signal $CLK_{IN+}$ at time $t_4$.

The flip-flop 332 clocks-in the current state of its inverted output qN at the time the intermediate clock signal INT_P transitions to the logic-high state. Since the inverted output qN is in the logic-low state at time $t_4$, the output qP of flip-flop 332 transitions to the logic-low state (and the inverted output qN transitions to the logic-high state) in response to the rising-edge transition of the intermediate clock signal INT_P. The flip-flop 334 clocks-in the current state of the output clock signal $CLK_{OUT+}$ at the time the intermediate clock signal INT_P transitions to the logic-high state. Since the output clock signal $CLK_{OUT+}$ is in the logic-high state at time $t_4$, the output qP' of flip-flop 334 transitions to the logic-high state in response to the rising-edge transition of the intermediate clock signal INT_P.

It is noted that, once the output clock signal $CLK_{OUT+}$ transitions to the logic-low state, the multiplexer 326 will once again select the outputs qP180 and qN180 of flip-flop 324 for output as the intermediate clock signals INT_N and INT_P. However, because the output qP180 of flip-flop 324 is in the logic-high state (and the inverted output qN180 is in the logic-low state) from times $t_4$ to $t_7$, the intermediate clock signals INT_N and INT_P may immediately revert back to their previous states after the change in selection by the multiplexer 326. In other words, INT_P transitions back to the logic-low state and INT_N transitions back to the logic-high state even before the next edge transition of the input clock signal $CLK_{IN+}$ (e.g., at time $t_5$).

At time $t_5$, the input clock signal $CLK_{IN+}$ transitions once again to the logic-low state. Since the edge counter 310 is triggered by rising-edge transitions of the input clock signal $CLK_{IN+}$, the count value does not change (e.g., count=1) and the control signal remains deasserted. More specifically, CTRL_P remains in the logic-low state and CTRL_N remains in the logic-high state at time $t_5$. The flip-flop 322 is also triggered by rising-edge transitions of the input clock signal $CLK_{IN+}$. Therefore, the output qP0 of flip-flop 322 remains in the logic-low state (and the inverted output qN0 remains in the logic-high state) at time $t_5$.

The flip-flop 324 may clock-in the current state of CTRL_N at time $t_5$. Since CTRL_N is in the logic-high state at time $t_5$ the output qP180 of flip-flop 324 remains in the logic-high state (and the inverted output qN180 remains in the logic-low state) in response to the falling-edge transition of the input clock signal $CLK_{IN+}$. At time $t_5$, the intermediate clock signals INT_P and INT_N continue to track the outputs qN180 and qP180, respectively, of flip-flop 324 (e.g., since the output clock signal $CLK_{OUT+}$ remains in the logic-low state). Since the state of the outputs qP180 and qN180 of flip-flop 324 has not changed at time $t_5$, the intermediate clock signals INT_N and INT_P also do not change. More specifically, INT_P remains in the logic-low state and INT_N remains in the logic-high state even after the falling-edge transition of the input clock signal $CLK_{IN+}$ at time $t_5$.

Because flip-flop 332 is triggered by rising-edge transitions of the intermediate clock signal INT_P (or falling-edge transitions of INT_N), the output qP of flip-flop 332 remains in the logic-low state (and the inverted output qN remains in the logic-high state) after time $t_5$. Because flip-flop 334 is also triggered by rising-edge transitions of the intermediate clock signal INT_P (or falling-edge transitions of INT_N), the output qP' of flip-flop 334 remains in the logic-high state after time $t_5$.

At time $t_6$, the input clock signal $CLK_{IN+}$ transitions once again to the logic-high state. Upon detecting the next rising-edge transition of the input clock signal $CLK_{IN+}$ at time $t_6$, the edge counter 310 may decrement its current count value (e.g., count=0). Because the count value has reached zero, the edge counter 310 may reassert the control signal (e.g., by driving CTRL_P to a logic-high state and driving CTRL_N to a logic-low state) and reset the count value (e.g., count=3) in response to the rising-edge transition of the input clock signal $CLK_{IN+}$ at time $t_6$.

The flip-flop 322 clocks-in the current state of CTRL_P in response to the rising-edge transition of the input clock signal $CLK_{IN+}$ at time $t_6$. Since CTRL_P is in a logic-low state at time $t_6$, the output qP0 of flip-flop 322 also remains in the logic-low state (and the inverted output qN0 remains in the logic-high state). Because flip-flop 324 is triggered by falling-edge transitions of the input clock signal $CLK_{IN+}$, the output qP180 of flip-flop 324 remains in the logic-high state (and the inverted output qN180 remains in a logic-low state). It is noted that the output clock signal $CLK_{OUT+}$ remains in the logic-low state at time $t_6$. Thus, the multiplexer 326 continues to select the outputs qP180 and qN180 of flip-flop 324 for output as the intermediate clock signals INT_N and INT_P at time $t_6$. More specifically, INT_P remains in the logic-low state while INT_N remains in the logic-high state at time $t_6$.

Because flip-flop 332 is triggered by rising-edge transitions of the intermediate clock signal INT_P (or falling-edge transitions of INT_N), the output qP of flip-flop 332 remains in the logic-low state (and the inverted output qN remains in the logic-high state) after time $t_6$. Because flip-flop 334 is also triggered by rising-edge transitions of the intermediate clock signal INT_P (or falling-edge transitions of INT_N), the output qP' of flip-flop 334 remains in the logic-high state after time $t_6$.

At time $t_7$, the input clock signal $CLK_{IN+}$ transitions once more to the logic-low state. Since the edge counter 310 is triggered by rising-edge transitions of the input clock signal $CLK_{IN+}$, the count value does not change (e.g., count=3) and the control signal remains asserted. More specifically, CTRL_P remains in the logic-high state and CTRL_N remains in the logic-low state at time $t_7$. The flip-flop 322 is also triggered by rising-edge transitions of the input clock signal $CLK_{IN+}$. Therefore, the output qP0 of flip-flop 322 remains in the logic-low state (and the inverted output qN0 remains in the logic-high state) at time $t_7$.

Because flip-flop 324 is triggered by falling-edge transitions of the input clock signal $CLK_{IN+}$, the flip-flop 324 may clock-in the current state of CTRL_N at time $t_7$. Since CTRL_N is in the logic-low state at time $t_7$, the output qP180 of flip-flop 324 transitions to the logic-low state (and the inverted output qN180 transitions to the logic-high state) in response to the falling-edge transition of the input clock signal $CLK_{IN+}$. At time $t_7$, the intermediate clock signals INT_P and INT_N continue to track the outputs qN180 and qP180, respectively, of flip-flop 324 (e.g., since the output clock signal $CLK_{OUT+}$ remains in the logic-low state). Therefore, the transition in the outputs qP180 and qN180 of the flip-flop 324 causes a corresponding transition in the intermediate clock signals INT_N and INT_P. More specifically, INT_P transitions to a logic-high state and INT_N transitions to a logic-low state in response to the falling-edge transition of the input clock signal $CLK_{IN+}$ at time $t_7$.

The flip-flop 332 clocks-in the current state of its inverted output qN at the time the intermediate clock signal INT_P transitions to the logic-high state. Since the inverted output qN of flip-flop 332 is in the logic-high state at time $t_7$, the output qP of flip-flop 332 transitions to the logic-high state (and the inverted output qN transitions to the logic-low state) in response to the rising-edge transition of the intermediate clock signal INT_P. The flip-flop 334 clocks-in the current state of the output clock signal $CLK_{OUT+}$ at the time the intermediate clock signal INT_P transitions to the logic-high state. Since the output clock signal $CLK_{OUT+}$ is in the logic-low state at time $t_7$, the output qP' of flip-flop 334 transitions to a logic-low state in response to the rising-edge transition of the intermediate clock signal INT_P.

It is noted that, once the output clock signal $CLK_{OUT+}$ transitions to the logic-high state, the multiplexer 326 will once again select the outputs qP0 and qN0 of flip-flop 322 for output as the intermediate clock signals INT_N and INT_P. However, because the output qP0 of flip-flop 322 is in the logic low-state (and the inverted output qN0 is in the logic-high state) after time $t_7$, the intermediate clock signals INT_N and INT_P remain unchanged even after the change in selection by the multiplexer 326. In other words, INT_P remains in the logic-high state and INT_N remains in the logic-low state even after the output clock signal $CLK_{OUT+}$ transitions to the logic-high state.

As shown in FIG. 4, none of the signals produced by the clock divider circuit 300 has a frequency greater than that of the input clock signal $CLK_{IN+}$. It is noted that the control signal (e.g., CTRL_P and CTRL_N) has a frequency equal to one-third the frequency of the input clock signal $CLK_{IN+}$ (e.g., $f_{IN}/3$) and the intermediate clock signal (e.g., INT_P and INT_N) has a frequency equal to two-thirds the frequency of the input clock signal $CLK_{IN+}$ (e.g., $2f_{IN}/3$). However, neither the control signal nor the intermediate clock signal has a 50% duty cycle. On the other hand, the output clock signal $CLK_{OUT}$ has a frequency equal to one-third the frequency of the input clock signal $CLK_{IN+}$ (e.g., $f_{IN}/3$) as well as a 50% duty cycle. Accordingly, the clock divider circuit 300 produces an output clock signal CLK$_{OUT}$ that is well-suited for high-speed (e.g., DDR) applications.

Figure 5:
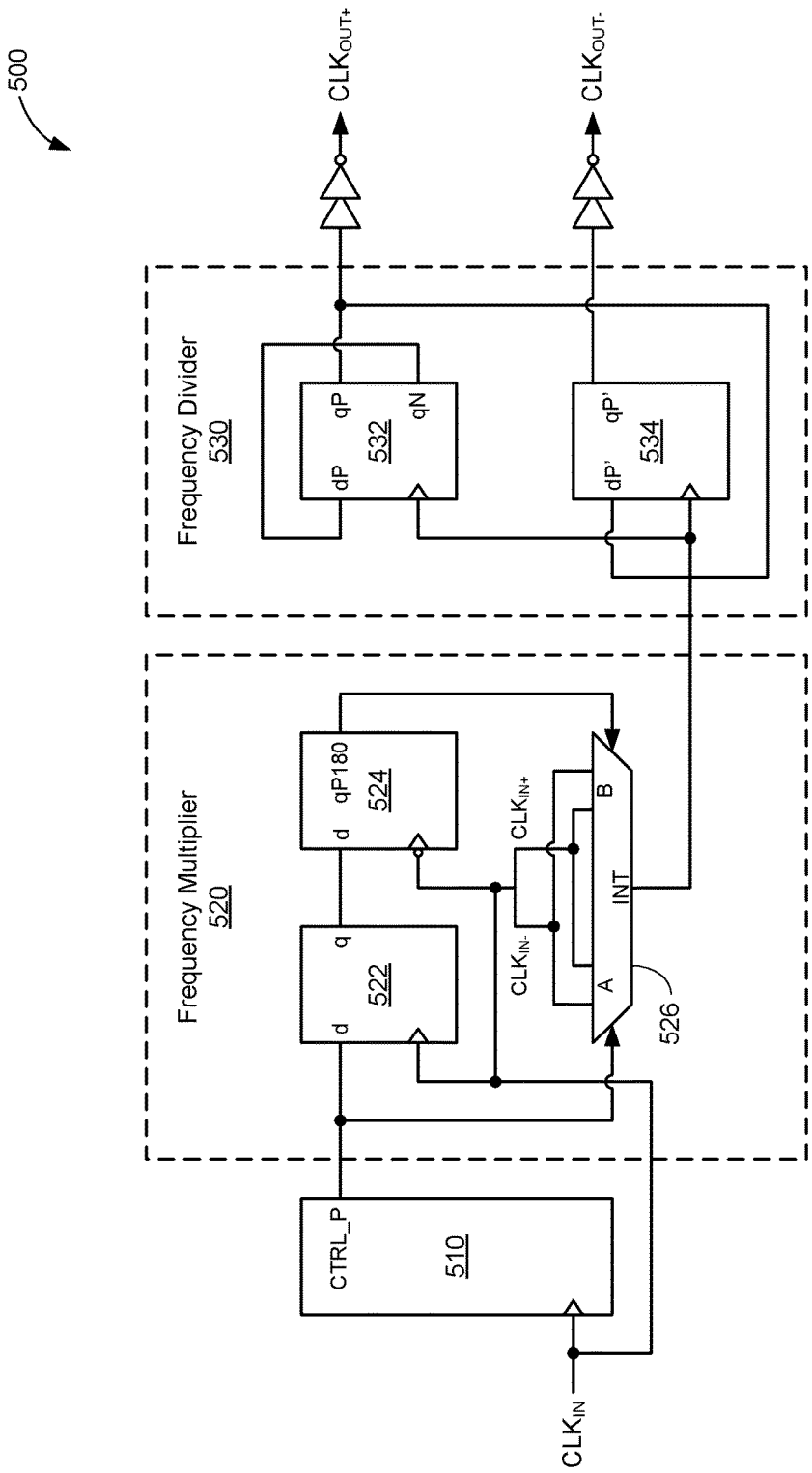
FIG. 5 shows a block diagram of a divide-by-N clock divider circuit capable of dividing the frequency of an input clock signal by an odd integer, in accordance with some other embodiments.

FIG. 5 shows a block diagram of a divide-by-N clock divider circuit 500 capable of dividing the frequency of an input clock signal by an odd integer, in accordance with some other embodiments. The clock divider circuit 500 may be an example embodiment of the clock divider circuit 200 of FIG. 2. For example, the clock divider circuit 500 may be configured to receive an input clock signal CLK$_{IN}$ and generate a frequency-adjusted output clock signal CLK$_{OUT}$ based on the input clock signal CLK$_{IN}$. In some aspects, the input clock signal CLK$_{IN}$ may be a differential clock signal (e.g., comprising a pair of complementary component signals) having a frequency equal to f$_{IN}$.

The clock divider circuit 500 may divide the frequency f$_{IN}$ of the input clock signal CLK$_{IN}$ by an integer (N), to generate the output clock signal CLK$_{OUT}$ with a frequency equal to f$_{IN}$/N. In some aspects, N may be an odd integer value. The output clock signal CLK$_{OUT}$ may also be a differential clock signal comprising a pair of complementary component signals (CLK$_{OUT+}$ and CLK$_{OUT-}$). The clock divider circuit 500 includes an edge counter 510, a frequency multiplier 520, and a frequency divider 530. The edge counter 510, frequency multiplier 520, and frequency divider 530 may be example embodiments of the edge counter 210, frequency multiplier 220, and frequency divider 230, respectively, of FIG. 2. For example, the edge counter 510 may produce a control signal based on a number of consecutive rising (or falling) edge transitions of the input clock signal CLK$_{IN}$, the frequency multiplier 520 may produce an intermediate clock signal by doubling the frequency of the control signal, and the frequency divider 530 may produce the output clock signal CLK$_{OUT}$ by halving the frequency of the intermediate clock signal.

The edge counter 510 includes an input to receive the input clock signal CLK$_{IN}$, and an output (CTRL_P) to provide the control signal based on the number of consecutive rising (or falling) edges of the input clock signal CLK$_{IN}$ counted by the edge counter 510. In some embodiments, the edge counter 510 may assert the control signal (e.g., by driving the CTRL_P output to a logic-high state) for every N consecutive rising edges of the input clock signal CLK$_{IN}$. In some aspects, the edge counter 510 may operate as a down-counter configured to count down a number (N) of rising edges detected in succession and assert the control signal when the countdown reaches zero. The edge counter 510 may reset the counter (e.g., to N) once the count value reaches zero. In some aspects, the edge counter 510 may subsequently deassert the control signal (e.g., by driving the CTRL_P output to a logic-low state) in response to the next rising-edge transition of the input clock signal CLK$_{IN}$.

The frequency multiplier 520 includes a first-in first-out (FIFO) register 522 and flip flop 524 and a multiplexer 526. The FIFO 522 is configured to receive the control signal from the edge counter 510, and to output a $$\left\lfloor \frac{N}{2} \right\rfloor \times T_{IN}$$

delayed version of the control signal based on rising edge transitions of the input clock signal CLK$_{IN}$. The flip-flop 524 is configured to receive the delayed version of the control signal and to output a further delayed version of this control signal based on falling edge transitions of the input clock signal CLK$_{IN}$. More specifically, the FIFO 522 includes an input (d) coupled to the output CTRL_P of the edge counter 510 and a clock input to receive the input clock signal CLK$_{IN}$. In some embodiments, the FIFO 522 may sample or clock-in the current state of the control signal (e.g., CTRL_P) when the input clock signal CLK$_{IN}$ transitions to a logic-high state (e.g., corresponding to a rising-edge transition of CLK$_{IN}$). The FIFO 522 further includes an output (q) to output a signal corresponding to the delayed state of the sampled control signal, referred to herein as a "first delayed control signal". As described in greater detail below, the FIFO 522 may delay the control signal by $$\left\lfloor \frac{N}{2} \right\rfloor \times T_{IN}$$

(where T$_{IN}$ represents the period of the input clock signal CLK$_{IN}$).

The flip-flop 524 includes an input (d) coupled to the output q of FIFO 522 and a clock input to receive an inverted clock signal. For example, the inverted clock signal may be complementary to the input clock signal CLK$_{IN}$. In some embodiments, the flip-flop 524 may sample or clock-in the current state of the first delayed control signal (e.g., at the output q of FIFO 522) when the inverted clock signal transitions to a logic-high state (e.g., corresponding to a falling-edge transition of CLK$_{IN}$). The flip-flop 524 further includes an output (qP180) to output a signal corresponding to the current state of the delayed control signal. Therefore, the output qP180 of the flip-flop 524 may correspond to a further delayed version of the control signal (referred to herein as a "second delayed control signal"). As described in greater detail below, the flip-flop 524 may delay the control signal by an additional half duty-cycle (or ½ the period of the control signal).

The multiplexer 526 includes a pair of inputs (A and B) coupled to the input clock signal CLK$_{IN}$ (e.g., including a non-inverted component signal CLK$_{IN+}$ and an inverted component signal CLK$_{IN-}$), and an output (INT) to provide the intermediate clock signal based on the signals received at one of its inputs. For example, the first input (A) of the multiplexer 526 may be coupled to receive the inverted clock signal CLK$_{IN-}$ (e.g., and the non-inverted clock signal CLK$_{IN+}$ as a complementary input), and the second input (B) of the multiplexer 526 may receive the non-inverted clock signal CLK$_{IN+}$ (e.g., and the inverted clock signal CLK$_{IN-}$ as a complementary input). In some embodiments, the multiplexer 526 may selectively provide the inverted clock signal CLK$_{IN-}$ or the non-inverted clock signal CLK$_{IN+}$ as the intermediate clock signal based on respective states of the control signal (e.g., at the output CTRL_P of the edge counter 510) and the second delayed control signal (e.g., at the output qP180 of flip-flop 524).

In the example of FIG. 5, the control signal (CTRL_P) controls the selection of the inverted clock signal CLK$_{IN-}$ and the second delayed control (qP180) signal controls the selection of the non-inverted clock signal CLK$_{IN+}$. For example, when the control signal (CTRL_P) is in a logic-high state, the multiplexer 526 will pass the inverted clock signal CLK$_{IN-}$ to its output INT. During this time, the intermediate clock signal will track the inverted clock signal CLK$_{IN-}$. When the second delayed control signal (qP180) is in a logic-high state, the multiplexer 526 will pass the non-inverted clock signal CLK$_{IN+}$ to its output INT. During this time, the intermediate clock signal will track the non-inverted clock signal $CLK_{IN+}$. As described in greater detail below, by selectively combining the inverted clock signal $CLK_{IN+}$ and the non-inverted clock signal $CLK_{IN-}$ in this manner, the multiplexer 526 may produce an intermediate clock signal having a frequency that is 2/N times that of the input clock signal $CLK_{IN}$.

The frequency divider 530 includes a pair of flip-flops 532 and 534. The flip-flops 532 and 534 are configured to receive the intermediate clock signal from the multiplexer 526, and to toggle the output clock signals $CLK_{OUT+}$ and $CLK_{OUT-}$ based on rising (or falling) edge transitions of the intermediate clock signal. In the example of FIG. 5, two flip-flops 532 and 534 are used to provide a differential output clock signal (e.g., including component signals $CLK_{OUT+}$ and $CLK_{OUT-}$). However, in other embodiments, the frequency divider 530 may include only a single flip-flop (such as flip-flop 532) to produce a single-ended output clock signal (e.g., including only $CLK_{OUT+}$).

The flip-flop 532 includes a clock input coupled to the output of the multiplexer 526 and an input (dP) coupled, in feedback, to an inverted output (qN) of the flip-flop 532. In some embodiments, the flip-flop 532 may sample or clock-in the current state of its inverted output qN when the intermediate clock signal transitions to a logic-high state (e.g., corresponding to a rising-edge transition of INT). The flip-flop 532 further includes an output (qP) to output a signal corresponding to the current state of the signal sampled at its input dP. In some embodiments, the output qP of the flip-flop 532 may be configured to provide the output clock signal $CLK_{OUT+}$. Since the output qP of the flip-flop 532 tracks the inverted output qN (e.g., with a given amount of delay), the flip-flop 532 may toggle the output clock signal $CLK_{OUT+}$ between a logic-high state and a logic-low state based on rising-edge transitions of the intermediate clock signal. As described in greater detail below, the flip-flop 532 may produce an output clock signal $CLK_{OUT+}$ having a 50% duty cycle and a frequency that is 1/N times the that of the input clock signal $CLK_{IN}$.

The flip-flop 534 includes a clock input coupled to the output of the multiplexer 526 and an input (dP') coupled to the output qP of the flip-flop 532. In some embodiments, the flip-flop 534 may sample or clock-in the current state of the output clock signal $CLK_{OUT+}$ when the intermediate clock signal transitions to a logic-high state (e.g., corresponding to a rising-edge transition of INT). The flip-flop 534 further includes an output (qP') to output a signal corresponding to the current state of the sampled output clock signal $CLK_{OUT+}$. In some embodiments, the output qP' of the flip-flop 534 may be configured to provide the complementary output clock signal $CLK_{OUT-}$. Since the output qP' of the flip-flop 534 tracks the output clock signal $CLK_{OUT+}$ (e.g., with a given amount of delay), the flip-flop 534 may toggle the complementary output clock signal $CLK_{OUT-}$ between a logic-high state and a logic-low state based on rising-edge transitions of the intermediate clock signal. More specifically, the complementary output clock signal $CLK_{OUT-}$ may correspond to a delayed version of the output clock signal $CLK_{OUT+}$ (e.g., delayed by a full duty-cycle). Moreover, because the output clock signal $CLK_{OUT+}$ has a 50% duty cycle, the flip-flop 534 may also produce a complementary output clock signal $CLK_{OUT-}$, having a 50% duty cycle, that is complementary to the output clock signal $CLK_{OUT+}$.

Figure 6:
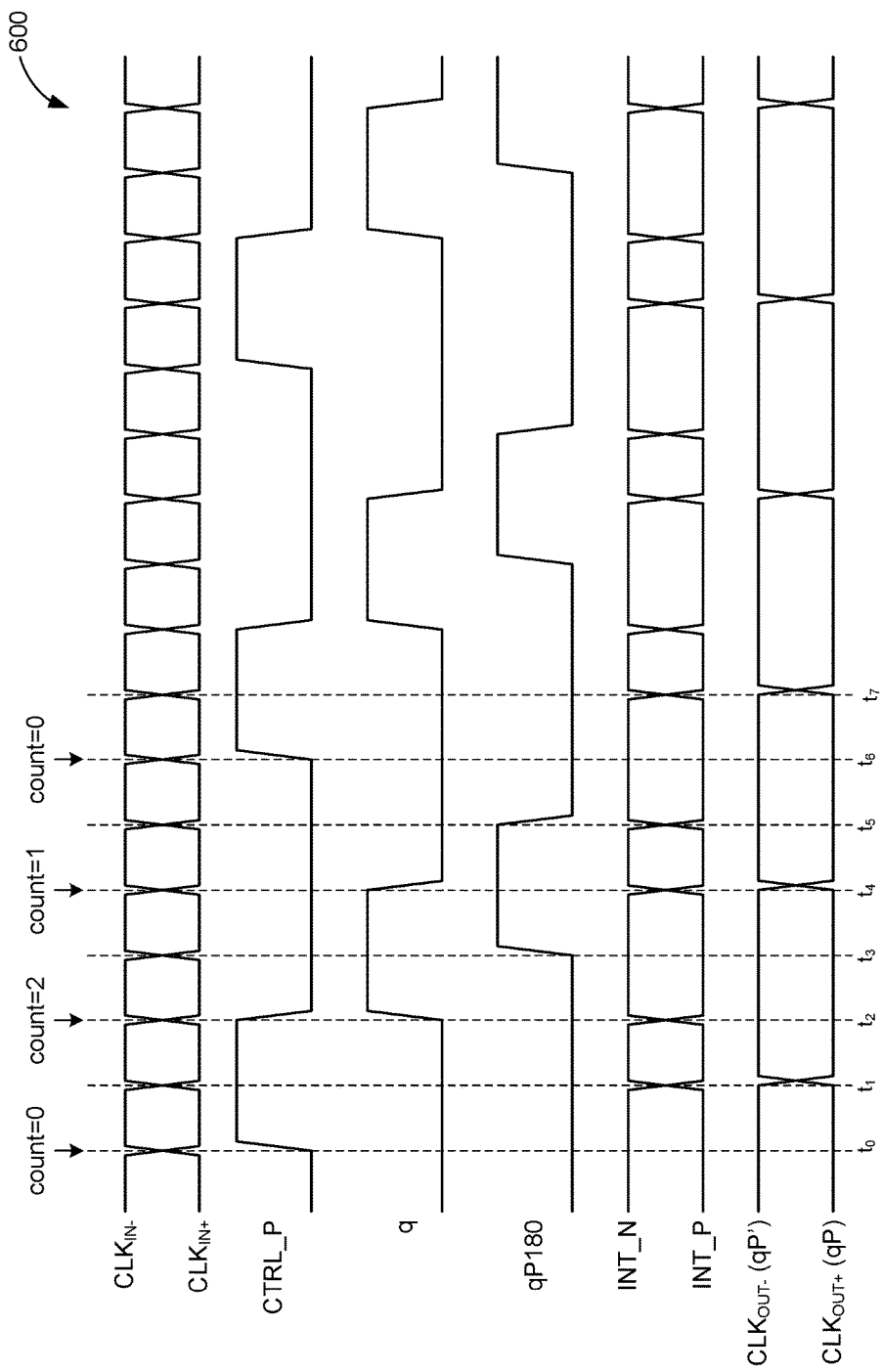
FIG. 6 shows a timing diagram depicting an example operation of the clock divider circuit of FIG. 5.

FIG. 6 shows a timing diagram depicting an example operation of the clock divider circuit 500 of FIG. 5. As described above, the clock divider circuit 500 may be configured to receive an input clock signal $CLK_{IN}$ and generate a frequency-adjusted output clock signal $CLK_{OUT}$ based on the input clock signal $CLK_{IN}$. In some aspects, the input clock signal $CLK_{IN}$ may be a differential clock signal comprising a pair of complementary component signals ($CLK_{IN+}$ and $CLK_{IN-}$). In the example of FIG. 6, the clock divider circuit 500 is implemented as a divide-by-three frequency divider (e.g., the frequency of $CLK_{OUT}$ is one-third the frequency of $CLK_{IN}$).

At time $t_0$, the input clock signal $CLK_{IN+}$ transitions to a logic-high state. In the example of FIG. 6, the edge counter 510 has already counted two consecutive rising-edge transitions of the input clock signal $CLK_{IN+}$ (e.g., count=1) prior to time $t_0$. Thus, upon detecting the rising-edge transition of the input clock signal $CLK_{IN+}$ at time $t_0$, the edge counter 510 may decrement its current count value (e.g., count=0). Because the count value has reached zero (e.g., indicating that the edge counter 510 has counted three consecutive rising-edge transitions of $CLK_{IN+}$ since the last time the count value was reset), the edge counter 510 may assert the control signal (e.g., by driving CTRL_P to a logic-high state) and reset the count value (e.g., count=3) in response to the rising-edge transition of the input clock signal $CLK_{IN+}$ at time $t_0$.

The FIFO 522 clocks-in the current state of CTRL_P in response to the rising-edge transition of the input clock signal $CLK_{IN+}$ at time $t_0$. Since CTRL_P is in a logic-low state at time $t_0$, the output q of FIFO 522 also remains in a logic-low state. At time $t_0$, the output qP180 of flip-flop 524 is in a logic-low state. However, because flip-flop 524 is triggered by falling-edge transitions of the input clock signal $CLK_{IN+}$ (or rising-edge transitions of the inverted clock signal $CLK_{IN-}$), the output qP180 of flip-flop 524 remains in the logic-low state. It is noted that both the control signal (CTRL_P) and the second delayed control signal (qP180) are in a logic-low state at time $t_0$. Thus, the multiplexer 526 may not output either of the clock signals $CLK_{IN+}$ or $CLK_{IN-}$ as the intermediate clock signal (INT_N and INT_P) at time $t_0$. Accordingly, INT_P remains in a logic-low state while INT_N remains in a logic-high state at time $t_0$.

However, once the control signal (CTRL_P) is in the logic-high state (e.g., immediately after time $t_0$), the multiplexer 526 will select the inverted clock signal $CLK_{IN-}$ for output as the intermediate clock signal. When the control signal (CTRL_P) is asserted, a positive component signal INT_P of the intermediate clock signal (also referred to herein simply as the intermediate clock signal) tracks the inverted clock signal $CLK_{IN-}$ whereas a negative component signal INT_N tracks a complement of the inverted clock signal (e.g., corresponding to the non-inverted clock signal $CLK_{IN+}$). It is noted that, by the time the intermediate clock signal begins tracking the inverted clock signal $CLK_{IN-}$, the inverted clock signal $CLK_{IN-}$ will already be in a logic-low state. Accordingly, INT_P may remain in the logic-low state and INT_N may remain in the logic-high state from times $t_0$ to $t_1$.

In the example of FIG. 6, the output qP of flip-flop 532 (e.g., corresponding to the output clock signal $CLK_{OUT+}$) is in a logic-low state at time $t_0$. However, because flip-flop 532 is triggered by rising-edge transitions of the intermediate clock signal INT_P (or falling-edge transitions of INT_N), the output qP of flip-flop 532 remains in the logic-low state (and the inverted output qN remains in a logic-high state) after time $t_0$. The output qP' of flip-flop 534 (e.g., corresponding to the complementary output clock signal $CLK_{OUT-}$) is in a logic-high state at time $t_0$. However, because flip-flop 534 is also triggered by rising-edge transitions of the intermediate clock signal INT_P (or falling-edge transitions of INT_N), the output qP' of flip-flop 534 remains in the logic-high state after time $t_0$.

At time $t_1$, the input clock signal $CLK_{IN+}$ transitions to a logic-low state. Since the edge counter 510 is triggered by rising-edge transitions of the input clock signal $CLK_{IN+}$, the count value does not change (e.g., count=3) and the control signal remains asserted. More specifically, CTRL_P remains in the logic-high state at time $t_1$. The FIFO 522 is also triggered by rising-edge transitions of the input clock signal $CLK_{IN+}$. Therefore, the output q of FIFO 522 remains in the logic-low state at time $t_1$.

Because flip-flop 524 is triggered by falling-edge transitions of the input clock signal $CLK_{IN+}$, the flip-flop 524 may clock-in the current state of the first delayed control signal (e.g., the output q of FIFO 522) at time $t_1$. Since the first delayed control signal (q) is in the logic-low state at time $t_1$, the output qP180 of flip-flop 524 remains in the logic-low state in response to the falling-edge transition of the input clock signal $CLK_{IN+}$. Since the control signal (CTRL_P) remains in the logic-high state and the second delayed control signal (qP180) remains in the logic-low state, at time $t_1$, the intermediate clock signal INT_P continues to track the inverted clock signal $CLK_{IN-}$. Therefore, the rising-edge transition of the inverted clock signal $CLK_{IN-}$ causes a corresponding rising-edge transition in the intermediate clock signal INT_P (and a falling-edge transition in INT_N) at time $t_1$.

The flip-flop 532 clocks-in the current state of its inverted output qN at the time the intermediate clock signal INT_P transitions to the logic-high state. Since the inverted output qN of flip-flop 532 is in the logic-high state at time $t_1$, the output qP of flip-flop 332 transitions to a logic-high state (and the inverted output qN transitions to a logic-low state) in response to the rising-edge transition of the intermediate clock signal INT_P. The flip-flop 534 clocks-in the current state of the output clock signal $CLK_{OUT+}$ at the time the intermediate clock signal INT_P transitions to the logic-high state. Since the output clock signal $CLK_{OUT+}$ is in the logic-low state at time $t_1$, the output qP' of flip-flop 534 transitions to a logic-low state in response to the rising-edge transition of the intermediate clock signal INT_P.

At time $t_2$, the input clock signal $CLK_{IN+}$ transitions back to the logic-high state. Upon detecting the next rising-edge transition of the input clock signal $CLK_{IN+}$ at time $t_2$, the edge counter 510 may decrement its current count value (e.g., count=2). Because the count value is greater than zero, the edge counter 510 may deassert the control signal (e.g., by driving CTRL_P to a logic-low state) in response to the rising-edge transition of the input clock signal $CLK_{IN+}$ at time $t_2$.

The FIFO 522 clocks-in the current state of CTRL_P in response to the rising-edge transition of the input clock signal $CLK_{IN+}$ at time $t_2$. Since CTRL_P is in the logic-high state at time $t_2$, the output q of FIFO 522 transitions to a logic-high state in response to the rising-edge transition of the input clock signal $CLK_{IN+}$ at time $t_2$. Because flip-flop 524 is triggered by falling-edge transitions of the input clock signal $CLK_{IN+}$, the output qP180 of flip-flop 524 remains in the logic-low state. Because the control signal (CTRL_P) is still in the logic-high state at time $t_2$, the multiplexer 326 continues to select the inverted clock signal $CLK_{IN-}$ for output as the intermediate clock signal INT_P at time $t_2$. Thus, the falling-edge transition of the inverted clock signal $CLK_{IN-}$ causes a corresponding falling-edge transition of the intermediate clock signal INT_P (and a rising-edge transition in INT_N) at time $t_2$.

It is noted that, after time $t_2$ (and before time $t_3$), both the control signal (CTRL_P) and the second delayed control signal (qP180) are once again in the logic-low state. Thus, the multiplexer 526 may not output either of the clock signals $CLK_{IN+}$ or $CLK_{IN-}$ as the intermediate clock signal INT_P during this time. Accordingly, INT_P remains in the logic-low state while INT_N remains in the logic-high state from times $t_2$ to $t_3$.

The output qP of flip-flop 532 is in the logic-high state at time $t_2$. However, because flip-flop 532 is triggered by rising-edge transitions of the intermediate clock signal INT_P (or falling-edge transitions of INT_N), the output qP of flip-flop 532 remains in the logic-high state (and the inverted output qN remains in the logic-low state) even after the falling-edge transition of the intermediate clock signal INT_P at time $t_2$. The output qP' of flip-flop 534 is in the logic-low state at time $t_2$. However, because flip-flop 534 is also triggered by rising-edge transitions of the intermediate clock signal INT_P (or falling-edge transitions of INT_N), the output qP' of flip-flop 534 remains in the logic-high state even after the falling-edge transition of the intermediate clock signal INT_P at time $t_2$.

At time $t_3$, the input clock signal $CLK_{IN+}$ transitions back to the logic-low state. Since the edge counter 510 is triggered by rising-edge transitions of the input clock signal $CLK_{IN+}$, the count value does not change (e.g., count=2) and the control signal remains deasserted. More specifically, CTRL_P remains in the logic-low state at time $t_3$. The FIFO 522 is also triggered by rising-edge transitions of the input clock signal $CLK_{IN+}$. Therefore, the output q of FIFO 522 remains in the logic-high state at time $t_3$.

The flip-flop 524 may clock-in the current state of the first delayed control signal (q) at time $t_3$. Since the first delayed control signal (q) is in the logic-high state at time $t_3$ the output qP180 of flip-flop 524 transitions to the logic-high state in response to the falling-edge transition of the input clock signal $CLK_{IN+}$. Once the second delayed control signal (qP180) is in the logic-high state (e.g., immediately after time $t_2$), the multiplexer 526 will select the non-inverted clock signal $CLK_{IN+}$ for output as the intermediate clock signal. When the second delayed control signal (qP180) is asserted, the positive component signal INT_P of the intermediate clock signal tracks the non-inverted clock signal $CLK_{IN+}$ whereas the negative component signal INT_N tracks a complement of the non-inverted clock signal (e.g., corresponding to the inverted clock signal $CLK_{IN-}$). It is noted that, by the time the intermediate clock signal begins tracking the non-inverted clock signal $CLK_{IN+}$, the non-inverted clock signal $CLK_{IN+}$ will already be in the logic-low state. Accordingly, INT_P may remain in the logic-low state and INT_N may remain in the logic-high state from times $t_3$ to $t_4$.

Because flip-flop 532 is triggered by rising-edge transitions of the intermediate clock signal INT_P (or falling-edge transitions of INT_N), the output qP of flip-flop 532 remains in the logic-high state (and the inverted output qN remains in the logic-low state) after time $t_3$. Because flip-flop 534 is also triggered by rising-edge transitions of the intermediate clock signal INT_P (or falling-edge transitions of INT_N), the output qP' of flip-flop 534 remains in the logic-low state after time $t_3$.

At time $t_4$, the input clock signal $CLK_{IN+}$ transitions once again to the logic-high state. Upon detecting the next rising-edge transition of the input clock signal $CLK_{IN+}$ at time $t_4$, the edge counter 510 may decrement its current count value (e.g., count=1). Because the count value is still greater than zero, the edge counter 510 may continue deasserting the control signal (e.g., by maintaining CTRL_P in the logic-low state) in response to the rising-edge transition of the input clock signal $CLK_{IN+}$ at time $t_4$.

The FIFO 522 clocks-in the current state of CTRL_P in response to the rising-edge transition of the input clock signal $CLK_{IN+}$ at time $t_4$. Since CTRL_P is in the logic-low state at time $t_4$, the output q of FIFO 522 transitions to the logic-low state in response to the rising-edge transition of the input clock signal $CLK_{IN+}$ at time $t_4$. Because flip-flop 524 is triggered by falling-edge transitions of the input clock signal $CLK_{IN+}$, the output qP180 of flip-flop 524 remains in the logic-high state. Because the second delayed control signal (qP180) is still in the logic-high state at time $t_4$, the multiplexer 526 continues to select the non-inverted clock signal $CLK_{IN+}$ for output as the intermediate clock signal INT_P at time $t_4$. Thus, the rising-edge transition of the non-inverted clock signal $CLK_{IN+}$ causes a corresponding rising-edge transition of the intermediate clock signal INT_P (and a falling-edge transition in INT_N) at time $t_4$.

The flip-flop 532 clocks-in the current state of its inverted output qN at the time the intermediate clock signal INT_P transitions to the logic-high state. Since the inverted output qN is in the logic-low state at time $t_4$, the output qP of flip-flop 532 transitions to the logic-low state (and the inverted output qN transitions to the logic-high state) in response to the rising-edge transition of the intermediate clock signal INT_P. The flip-flop 534 clocks-in the current state of the output clock signal $CLK_{OUT+}$ at the time the intermediate clock signal INT_P transitions to the logic-high state. Since the output clock signal $CLK_{OUT+}$ is in the logic-high state at time $t_4$, the output qP' of flip-flop 534 transitions to the logic-high state in response to the rising-edge transition of the intermediate clock signal INT_P.

At time $t_5$, the input clock signal $CLK_{IN+}$ transitions once again to the logic-low state. Since the edge counter 510 is triggered by rising-edge transitions of the input clock signal $CLK_{IN+}$, the count value does not change (e.g., count=1) and the control signal remains deasserted. More specifically, CTRL_P remains in the logic-low state at time $t_5$. The FIFO 522 is also triggered by rising-edge transitions of the input clock signal $CLK_{IN+}$. Therefore, the output q of FIFO 522 remains in the logic-low state at time $t_5$.

The flip-flop 524 may clock-in the current state of the first delayed control signal (q) at time $t_5$. Since the first delayed control signal (q) is in the logic-low state at time $t_5$ the output qP180 of flip-flop 524 transitions to the logic-low state in response to the falling-edge transition of the input clock signal $CLK_{IN+}$. However, because the second delayed control signal (qP180) is still in the logic-high state at time $t_5$, the multiplexer 526 continues to select the non-inverted clock signal $CLK_{IN+}$ for output as the intermediate clock signal INT_P at time $t_5$. Thus, the falling-edge transition of the non-inverted clock signal $CLK_{IN+}$ causes a corresponding falling-edge transition of the intermediate clock signal INT_P (and a rising-edge transition in INT_N) at time $t_5$.

It is noted that, after time $t_5$ (and before time $t_6$), both the control signal (CTRL_P) and the second delayed control signal (qP180) are once again in the logic-low state. Thus, the multiplexer 526 may not output either of the clock signals $CLK_{IN+}$ or $CLK_{IN-}$ as the intermediate clock signal INT_P during this time. Accordingly, INT_P remains in the logic-low state while INT_N remains in the logic-high state from times $t_5$ to $t_6$.

Because flip-flop 532 is triggered by rising-edge transitions of the intermediate clock signal INT_P (or falling-edge transitions of INT_N), the output qP of flip-flop 532 remains in the logic-low state (and the inverted output qN remains in the logic-high state) after time $t_5$. Because flip-flop 534 is also triggered by rising-edge transitions of the intermediate clock signal INT_P (or falling-edge transitions of INT_N), the output qP' of flip-flop 534 remains in the logic-high state after time $t_5$.

At time $t_6$, the input clock signal $CLK_{IN+}$ transitions once again to the logic-high state. Upon detecting the next rising-edge transition of the input clock signal $CLK_{IN+}$ at time $t_6$, the edge counter 510 may decrement its current count value (e.g., count=0). Because the count value has reached zero, the edge counter 510 may reassert the control signal (e.g., by driving CTRL_P to a logic-high state) and reset the count value (e.g., count=3) in response to the rising-edge transition of the input clock signal $CLK_{IN+}$ at time $t_6$.

The FIFO 522 clocks-in the current state of CTRL_P in response to the rising-edge transition of the input clock signal $CLK_{IN+}$ at time $t_6$. Since CTRL_P is in a logic-low state at time $t_6$, the output q of FIFO 522 also remains in the logic-low state. Because flip-flop 524 is triggered by falling-edge transitions of the input clock signal $CLK_{IN+}$, the output qP180 of flip-flop 524 remains in the logic-low state. Once the control signal (CTRL_P) is in the logic-high state (e.g., immediately after time $t_6$), the multiplexer 526 will select the inverted clock signal $CLK_{IN-}$ for output as the intermediate clock signal. It is noted that, by the time the intermediate clock signal begins tracking the inverted clock signal $CLK_{IN-}$, the inverted clock signal $CLK_{IN-}$ will already be in a logic-low state. Accordingly, INT_P may remain in the logic-low state and INT_N may remain in the logic-high state from times $t_6$ to $t_7$.

Because flip-flop 532 is triggered by rising-edge transitions of the intermediate clock signal INT_P (or falling-edge transitions of INT_N), the output qP of flip-flop 532 remains in the logic-low state (and the inverted output qN remains in the logic-high state) after time $t_6$. Because flip-flop 534 is also triggered by rising-edge transitions of the intermediate clock signal INT_P (or falling-edge transitions of INT_N), the output qP' of flip-flop 534 remains in the logic-high state after time $t_6$.

At time $t_7$, the input clock signal $CLK_{IN+}$ transitions once more to the logic-low state. Since the edge counter 510 is triggered by rising-edge transitions of the input clock signal $CLK_{IN+}$, the count value does not change (e.g., count=3) and the control signal remains asserted. More specifically, CTRL_P remains in the logic-high state at time $t_7$. The FIFO 522 is also triggered by rising-edge transitions of the input clock signal $CLK_{IN+}$. Therefore, the output q of FIFO 522 remains in the logic-low state at time $t_7$.

Because flip-flop 524 is triggered by falling-edge transitions of the input clock signal $CLK_{IN+}$, the flip-flop 524 may clock-in the current state of the first delayed control signal (q) at time $t_7$. Since the first delayed control signal (q) is in the logic-low state at time $t_7$, the output qP180 of flip-flop 524 remains in the logic-low state in response to the falling-edge transition of the input clock signal $CLK_{IN+}$. Since the control signal (CTRL_P) remains in the logic-high state and the second delayed control signal (qP180) remains in the logic-low state, at time $t_7$, the intermediate clock signal INT_P continues to track the inverted clock signal $CLK_{IN-}$. Therefore, the rising-edge transition of the inverted clock signal $CLK_{IN-}$ causes a corresponding rising-edge transition in the intermediate clock signal INT_P (and a falling-edge transition in INT_N) at time $t_7$.

The flip-flop 532 clocks-in the current state of its inverted output qN at the time the intermediate clock signal INT_P transitions to the logic-high state. Since the inverted output qN of flip-flop 532 is in the logic-high state at time $t_7$, the output qP of flip-flop 532 transitions to the logic-high state (and the inverted output qN transitions to the logic-low state) in response to the rising-edge transition of the intermediate clock signal INT_P. The flip-flop 534 clocks-in the current state of the output clock signal $CLK_{OUT+}$ at the time the intermediate clock signal INT_P transitions to the logic-high state. Since the output clock signal $CLK_{OUT+}$ is in the logic-low state at time $t_7$, the output qP' of flip-flop 534 transitions to the logic-low state in response to the rising-edge transition of the intermediate clock signal INT_P.

As shown in FIG. 6, none of the signals produced by the clock divider circuit 500 has a frequency greater than that of the input clock signal $CLK_{IN+}$. It is noted that the control signal (e.g., CTRL_P) has a frequency equal to one-third the frequency of the input clock signal $CLK_{IN+}$ (e.g., $f_{IN}/3$) and the intermediate clock signal (e.g., INT_P and INT_N) has a frequency equal to two-thirds the frequency of the input clock signal $CLK_{IN+}$ (e.g., $2f_{IN}/3$). However, neither the control signal nor the intermediate clock signal has a 50% duty cycle. On the other hand, the output clock signal $CLK_{OUT}$ has a frequency equal to one-third the frequency of the input clock signal $CLK_{IN+}$ (e.g., $f_{IN}/3$) as well as a 50% duty cycle. Accordingly, the clock divider circuit 500 produces an output clock signal $CLK_{OUT}$ that is well-suited for high-speed (e.g., DDR) applications.

Figure 7:
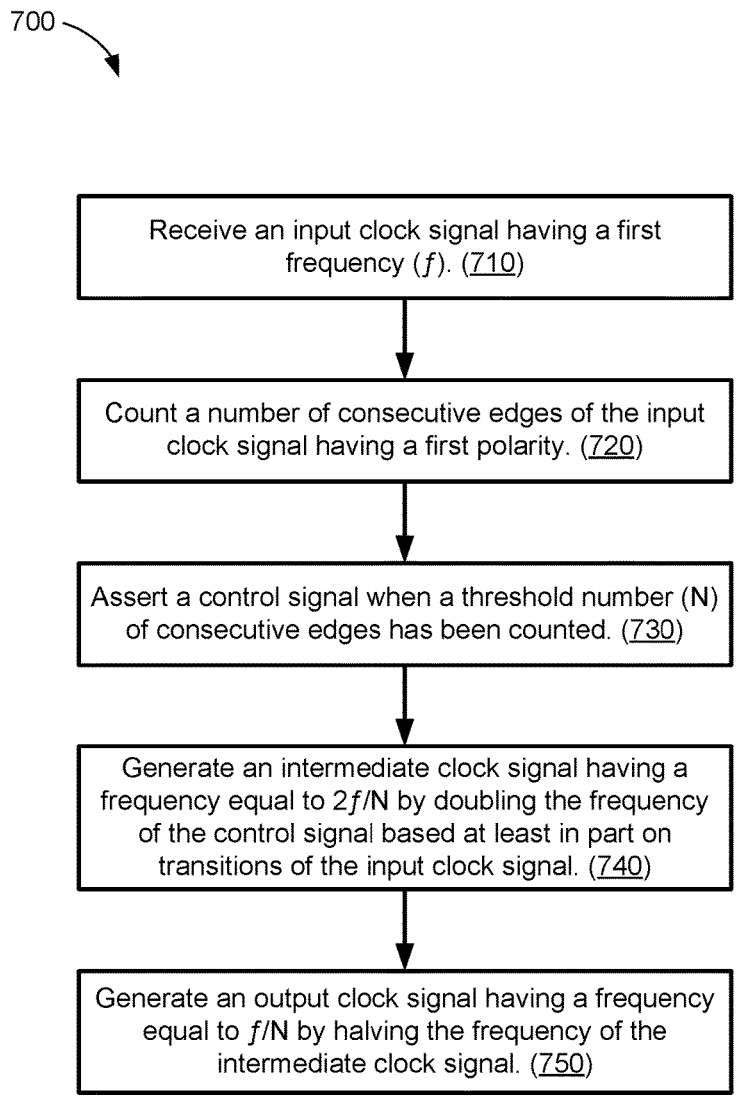
FIG. 7 is an illustrative flow chart depicting an example operation for dividing the frequency of an input clock signal by an odd integer, in accordance with some embodiments.

FIG. 7 is an illustrative flow chart depicting an example operation 700 for dividing the frequency of an input clock signal by an odd integer, in accordance with some embodiments. Although described below with respect to the clock divider circuit 200 of FIG. 2, the example operation 700 may be performed by any suitable clock divider circuit of the present embodiments (e.g., such as clock divider circuit 300 of FIG. 3 and/or clock divider circuit 500 of FIG. 5).

The clock divider circuit 200 receives an input clock signal having a first frequency (f) (710). For example, the input clock signal $CLK_{IN}$ may be a differential signal comprising a pair of complementary component signals (e.g., $CLK_{IN+}$ and $CLK_{IN-}$). The clock divider circuit 200 may divide the frequency f of the input clock signal $CLK_{IN}$ by an integer (N), to generate a balanced output clock signal $CLK_{OUT}$ with a frequency equal to f/N (e.g., and a 50% duty cycle). In some aspects, N may be an odd integer value.

The clock divider 200 counts a number of consecutive edges of the input clock signal having a first polarity (720). For example, the edge counter 210 may count a number of consecutive edge transitions of the same polarity (e.g., rising edges or falling edges) in the input clock signal $CLK_{IN}$. In some embodiments, the edge counter 210 may be a down-counter configured to count down a number (N) of edges detected in succession.

The clock divider asserts a control signal when a threshold number (N) of consecutive edges has been counted (730). As described above, the edge counter 210 may count down N consecutive rising (or falling) edges of the input clock signal $CLK_{IN}$. When the countdown reaches zero, the edge counter 210 may assert the control signal, for example, by driving the control signal to a logic-high state. In some aspects, the control signal may remain in the logic-high state for a duration equal to $$\left\lfloor \frac{N}{2} \right\rfloor \times T$$

(where T represents the period of the input clock signal $CLK_{IN}$). For example, when N=3, the control signal may remain asserted until the edge counter 210 detects the next edge rising (or falling) edge of the input clock signal $CLK_{IN}$. More specifically, the edge counter 210 may deassert the control signal when the next rising (or falling) edge of the input clock signal $CLK_{IN}$ arrives.

The clock divider generates an intermediate clock signal having a frequency equal to 2f/N by doubling the frequency of the control signal based at least in part on transitions of the input clock signal (740). For example, the frequency multiplier 220 may generate delayed versions of the control signal based on transitions of the input clock signal $CLK_{IN}$, and using the delayed control signals to generate the intermediate clock signal. In some embodiments, the frequency multiplier 220 may include a plurality of parallel flip-flops configured to sample and output multiple delayed versions of the control signal. The delayed versions of the control signal may be selectively combined (e.g., via a multiplexer) to produce the intermediate clock signal. In some other embodiments, the frequency multiplier 220 may include a plurality of flip-flops coupled in series to sample and output a delayed version of the control signal. The delayed version of the control signal may then be used, together with the original control signal, to selectively combine the complementary component signals of the input clock signal $CLK_{IN+}$ and $CLK_{IN-}$ to produce the intermediate clock signal.

The clock divider 200 then generates an output clock signal having a frequency equal to f/N by halving the frequency of the intermediate clock signal (750). For example, the frequency divider 230 may toggle the output clock signal $CLK_{OUT}$ (e.g., between a logic-high state and a logic-low state) based on transitions of the intermediate clock signal. In some embodiments, the frequency divider 230 may include one or more flip-flops that are triggered by the intermediate clock signal. For example, the frequency divider 230 may include a first flip-flop to toggle (e.g., assert and deassert) the output clock signal $CLK_{OUT}$ in response to rising (or falling) edge transitions of the intermediate clock signal. In some aspects, the frequency divider 230 may include a second flip-flop to provide, and toggle, a complementary output clock signal (e.g., $CLK_{OUT+}$ or $CLK_{OUT-}$) in response to rising (or falling) edge transitions of the intermediate clock signal. As shown in FIGS. 4 and 6, the resulting output clock signal $CLK_{OUT}$ has a frequency equal to $f_{IN}/N$ and a 50% duty cycle.

It is noted that, in generating the output clock signal $CLK_{OUT}$, the operation 700 never produces a signal at a higher frequency than that of the input clock signal $CLK_{IN}$. As shown in FIGS. 4 and 6, the frequency of the control signal (e.g., $f_{IN}/N$) and the frequency of the intermediate clock signal INT (e.g., $2f_{IN}/N$) are both lower than the frequency of the input clock signal $CLK_{IN}$ (e.g., for any odd integer values of N≥3). Accordingly, the frequency-dividing operation 700 of the present embodiments is not limited by the frequency of the input clock signal $CLK_{IN}$, and may therefore be more suitable for high-speed applications than conventional frequency-dividing techniques.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A clock divider circuit, comprising:
an input to receive an input clock signal having a first frequency (f);
an edge counter to count a number of consecutive edges of the input clock signal having a first polarity, and to assert a control signal when a threshold number (N) of consecutive edges has been counted, wherein N is an odd integer;
a frequency multiplier to generate an intermediate clock signal having a frequency equal to 2f/N by doubling the frequency of the control signal based at least in part on transitions of the input clock signal; and
a frequency divider to generate an output clock signal having a frequency equal to f/N by halving the frequency of the intermediate clock signal.

2. The clock divider circuit of claim 1, wherein the output clock signal has a 50% duty cycle.

3. The clock divider circuit of claim 1, wherein the edge counter is configured to assert the control signal for a duration equal to $$\left\lfloor \frac{N}{2} \right\rfloor \times T,$$

where T is a period of the input clock signal.

4. The clock divider circuit of claim 1, wherein the frequency multiplier is further configured to:
generate a first delayed control signal by delaying the control signal by a full duty cycle;
generate a second delayed control signal by delaying the control signal by a half duty cycle; and
selectively combine the first delayed control signal with the second delayed control signal, based at least in part on an output of the frequency divider, to produce the intermediate clock signal.

5. The clock divider circuit of claim 3, wherein the control signal is a differential signal comprising a positive component signal and a negative component signal, the frequency multiplier comprising:
a first flip-flop having an input to receive the positive component signal and an output to provide the first delayed control signal based on transitions of the input clock signal;
a second flip-flop having an input to receive the negative component signal and an output to provide the second delayed control signal based on transitions of an inverted clock signal, wherein the inverted clock signal is complementary to the input clock signal; and
a multiplexer to selectively output one of the first delayed control signal or the second delayed control signal as the intermediate clock signal based on a state of the output clock signal.

6. The clock divider circuit of claim 5, wherein the first delayed control signal is provided by an inverted output of the first flip-flop, and wherein the second delayed control signal is provided by an inverted output of the second flip-flop.

7. The clock divider circuit of claim 1, wherein the frequency multiplier is further configured to:
generate a delayed control signal by delaying the control signal by half its period; and
selectively combine the input clock signal with an inverted clock signal to produce the intermediate clock signal based on the control signal and the delayed control signal, wherein the inverted clock signal is complementary to the input clock signal.

8. The clock divider circuit of claim 7, wherein the frequency multiplier comprises:
a first-in first-out (FIFO) register having an input to receive the control signal and an output to provide an intermediate control signal by delaying the control signal by a duration equal to $$\left\lfloor \frac{N}{2} \right\rfloor \times T,$$

where T is a period of the input clock signal;
a flip-flop having an input to receive the intermediate control signal and an output to provide the delayed control signal based on transitions of the inverted clock signal; and
a multiplexer to selectively output one of the input clock signal or the inverted clock signal as the intermediate clock signal based on respective states of the control signal and the delayed control signal.

9. The clock divider circuit of claim 8, wherein the multiplexer is further configured to:
output the input clock signal as the intermediate clock signal when the delayed control signal is asserted; and
output the inverted clock signal as the intermediate clock signal when the control signal is asserted.

10. The clock divider circuit of claim 1, wherein frequency divider comprises:
a flip-flop having an input to receive an inverted output signal and an output to provide the output signal based on transitions of the intermediate clock signal, wherein the inverted output signal is complementary to the output clock signal.

11. A method, comprising:
receiving an input clock signal having a first frequency (f);
counting a number of consecutive edges of the input clock signal having a first polarity;
asserting a control signal when a threshold number (N) of consecutive edges has been counted, wherein N is an odd integer;
generating an intermediate clock signal having a frequency equal to 2f/N by doubling the frequency of the control signal based at least in part on transitions of the input clock signal; and
generating an output clock signal having a frequency equal to f/N by halving the frequency of the intermediate clock signal.

12. The method of claim 11, wherein the output clock signal has a 50% duty cycle.

13. The method of claim 11, wherein the control signal is asserted for a duration equal to $$\left\lfloor \frac{N}{2} \right\rfloor \times T,$$

where T is a period of the input clock signal.

14. The method of claim 11, wherein generating the intermediate clock signal comprises:
generating a first delayed control signal by delaying the control signal by a full duty cycle;
generating a second delayed control signal by delaying the control signal by a half duty cycle; and
selectively combining the first delayed control signal with the second delayed control signal, based at least in part on an output of the frequency divider, to produce the intermediate clock signal.

15. The method of claim 13, wherein the control signal is a differential signal comprising a positive component signal and a negative component signal, and wherein generating the intermediate clock signal comprises:
generating the first delayed control signal by delaying the positive component signal based on transitions of the input clock signal;
generating the second delayed control signal by delaying the negative component signal based on transitions of an inverted clock signal, wherein the inverted clock signal is complementary to the input clock signal; and
selectively providing one of the first delayed control signal or the second delayed control signal as the intermediate clock signal based on a state of the output clock signal.

16. The method of claim 15, wherein the first delayed control signal is complementary to the delayed positive component signal, and wherein the second delayed control signal is complementary to the delayed negative component signal.

17. The method of claim 11, wherein generating the intermediate clock signal comprises:
generating a delayed control signal by delaying the control signal by half its period; and
selectively combining the input clock signal with an inverted clock signal to produce the intermediate clock signal based on the control signal and the delayed control signal, wherein the inverted clock signal is complementary to the input clock signal.

18. The method of claim 17, wherein generating the intermediate clock signal comprises:
generating an intermediate control signal by delaying the control signal by a duration equal to $$\left\lfloor \frac{N}{2} \right\rfloor \times T,$$

where T is a period of the input clock signal;
generating the delayed control signal by delaying the intermediate control signal based on transitions of the inverted clock signal; and
selectively providing one of the input clock signal or the inverted clock signal as the intermediate clock signal based on respective states of the control signal and the delayed control signal.

19. The method of claim 18, wherein the selectively providing comprises:
outputting the input clock signal as the intermediate clock signal when the delayed control signal is asserted; and
outputting the inverted clock signal as the intermediate clock signal when the control signal is asserted.

20. The method of claim 16, wherein generating the output clock signal comprises:
generating the output clock signal by delaying an inverted output signal based on transitions of the intermediate clock signal, wherein the inverted output signal is complementary to the output clock signal.

* * * * *